(12) United States Patent
Shimizu et al.

(10) Patent No.: US 7,825,458 B2
(45) Date of Patent: Nov. 2, 2010

(54) NONVOLATILE SEMICONDUCTOR MEMORY AND MANUFACTURING METHOD THEREOF

(75) Inventors: Tatsuo Shimizu, Tokyo (JP); Koichi Muraoka, Sagamihara (JP); Masato Koyama, Miura-gun (JP); Shoko Kikuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 12/050,427

(22) Filed: Mar. 18, 2008

(65) Prior Publication Data
US 2008/0237699 A1 Oct. 2, 2008

(30) Foreign Application Priority Data
Mar. 28, 2007 (JP) ............... 2007-085705

(51) Int. Cl.
*H01L 29/792* (2006.01)
(52) U.S. Cl. ............ 257/324; 257/314; 257/315; 257/316; 257/320; 257/E21.209; 257/E21.21; 257/E21.179; 257/E21.182; 257/E29.3; 257/E29.309; 257/E21.324; 438/257
(58) Field of Classification Search ............ 257/314, 257/315, 316, 317, 320, 321, 324, 325, 411, 257/E21.21
See application file for complete search history.

(56) References Cited
U.S. PATENT DOCUMENTS
2006/0163676 A1* 7/2006 Shimizu et al. ............ 257/410
2006/0170033 A1* 8/2006 Lee et al. ............ 257/324
2006/0211205 A1* 9/2006 Jeon et al. ............ 438/264
2008/0217680 A1* 9/2008 Shimizu et al. ............ 257/324

FOREIGN PATENT DOCUMENTS
JP 2006-270102 10/2006
KR 10-0674965 1/2007

OTHER PUBLICATIONS
U.S. Appl. No. 12/405,626, filed Mar. 17, 2009, Shingu, et al.
U.S. Appl. No. 12/051,274, filed Mar. 19, 2008, Shimizu, et al.
U.S. Appl. No. 12/189,400, filed Aug. 11, 2008, Shimizu, et al.
U.S. Appl. No. 12/714,841, filed Mar. 1, 2010, Shimizu, et al.

* cited by examiner

*Primary Examiner*—Davienne Monbleau
*Assistant Examiner*—Farid Khan
(74) *Attorney, Agent, or Firm*—Oblon, Spivak, McClelland, Maier & Neustadt, L.L.P.

(57) ABSTRACT

A nonvolatile semiconductor memory includes a source area and a drain area provided on a semiconductor substrate with a gap which serves as a channel area, a first insulating layer, a charge accumulating layer, a second insulating layer (block layer) and a control electrode, formed successively on the channel area, and the second insulating layer is formed by adding an appropriate amount of high valence substance into base material composed of substance having a sufficiently higher dielectric constant than the first insulating layer so as to accumulate a large amount of negative charges in the block layer by localized state capable of trapping electrons, so that the high dielectric constant of the block layer and the high electronic barrier are achieved at the same time.

11 Claims, 7 Drawing Sheets

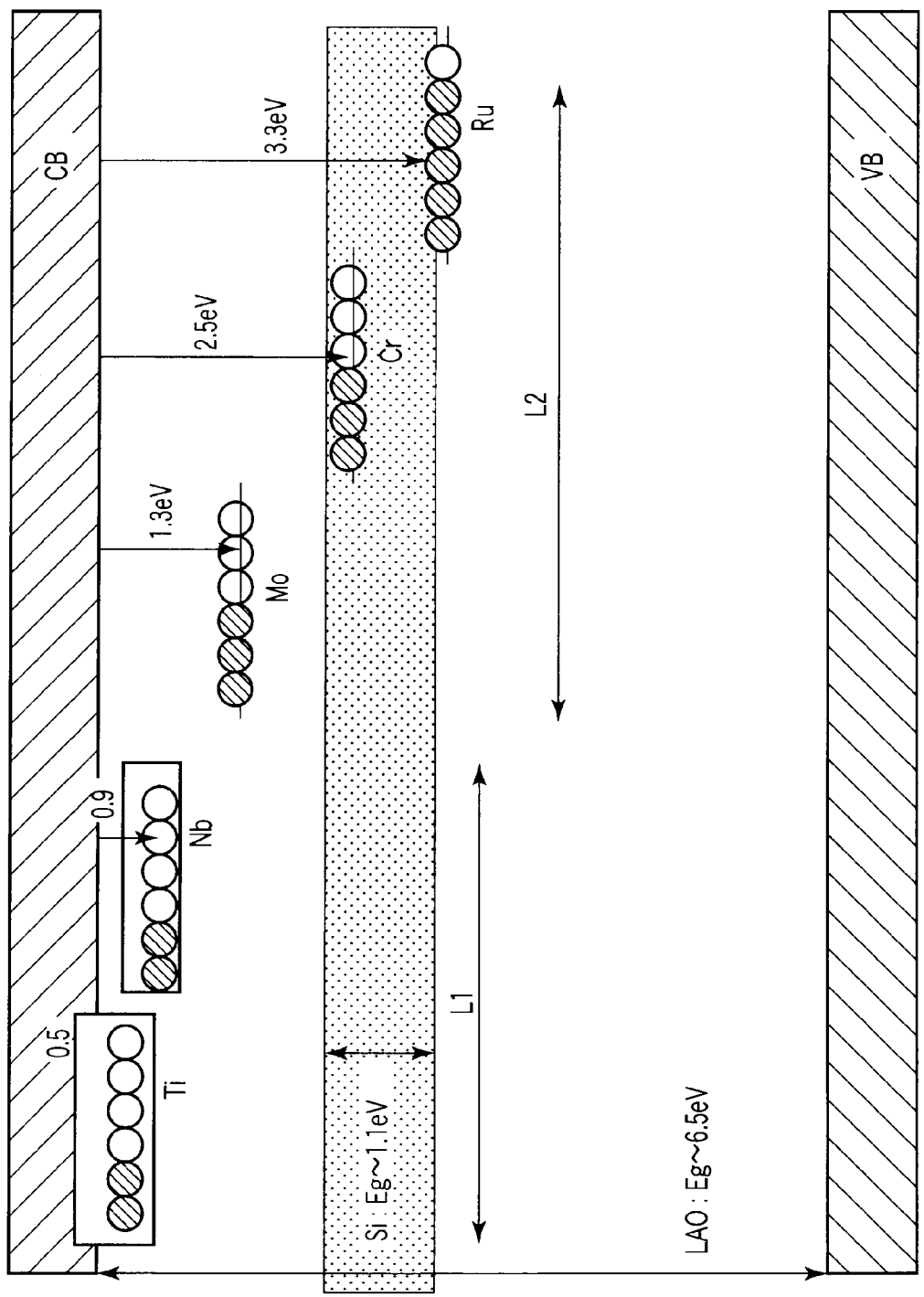
F I G. 7

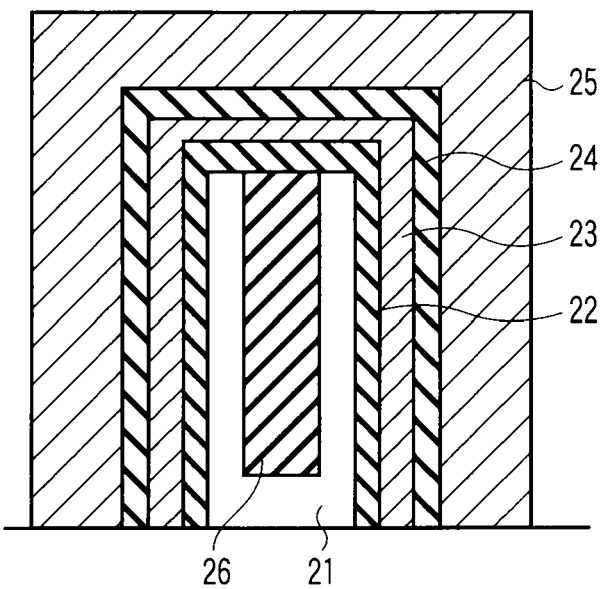
F I G. 12
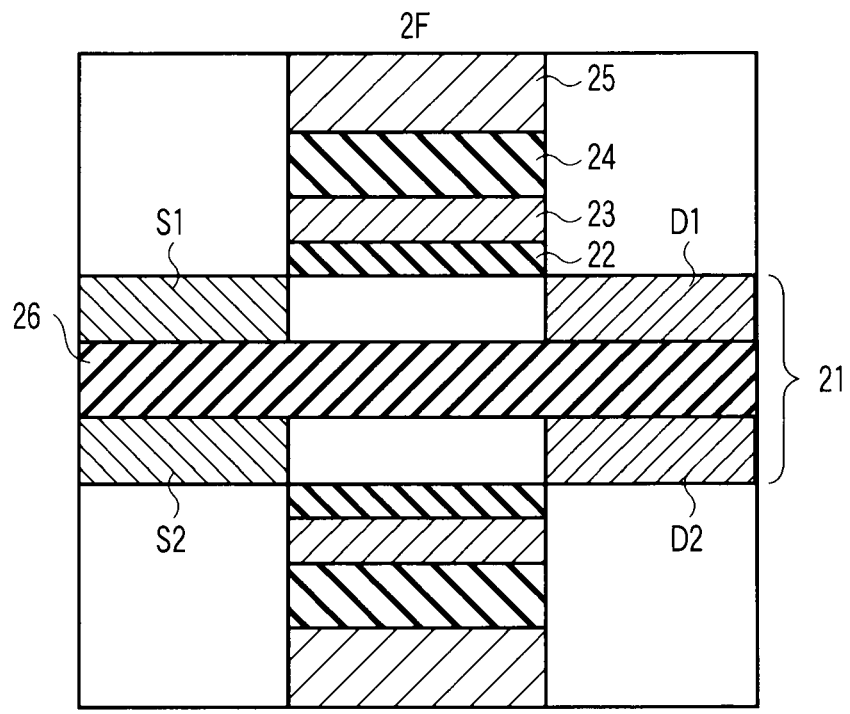
F I G. 13

NONVOLATILE SEMICONDUCTOR MEMORY AND MANUFACTURING METHOD THEREOF

CROSS-REFERENCE TO RELATED APPLICATIONS

This application is based upon and claims the benefit of priority from prior Japanese Patent Application No. 2007-085705, filed Mar. 28, 2007, the entire contents of which are incorporated herein by reference.

BACKGROUND OF THE INVENTION

1. Field of the Invention

The present invention relates to a nonvolatile semiconductor memory which creates a localized level in high dielectric material so as to trap electrons for use as a block layer and a manufacturing method thereof.

2. Description of the Related Art

Generally, the flash memory which is one of the nonvolatile semiconductor memories is a nonvolatile memory which does not require electric holding operation (supplying holding power) for memory, and has been widely used in diversified electronic devices because programs and the like can be written easily after a product is completed. The NAND flash memory subsequent to next generation is demanded to be miniaturized further and operate at a lower voltage. The NAND flash memory subsequent to the next generation has been demanded to be formed in a flat cell because an inter-poly-dielectrics (IPD) cannot be buried between the cells easily. To secure the amount of electric charge due to shortage of a contact area between the IPD and the floating gate (FG) and achieve interference suppression between cells and lower voltage, technology for thinning the IPD, FG and tunnel film is indispensable.

However, if a local defect is generated in the tunnel film, most of accumulated electric charge is eliminated due to that defect because electric charges are accumulated on a metallic gate film. Thus, in case of the FG structure, the tunnel film needs to be thickened more than a specified level, which is a significant obstacle against miniaturization.

Instead of this FG structure, metal-oxide-nitride-oxide-semiconductor (MONOS) is a candidate as one of the memory cell structure having a discrete type charge accumulating layer. The memory cell containing the charge accumulating layer of the conventional MONOS has a structure in which a tunnel layer formed of an insulating film (oxide film), a trap layer formed of a silicon nitride film, a block layer formed of an insulating film and a control electrode are successively overlaid on a channel area of a silicon substrate in which for example source and drain are formed.

The block layer of the MONOS serves as a barrier for accumulating charges in the charge trap layer and needs to have a function of preventing charges from flowing out to the control electrode side. Additionally, the block layer needs to have a function of accumulating charges in the charge trap film and preventing electrons from flowing in from an electrode side. For that purpose, dielectric constant needs to be sufficiently high and the barrier against electrons needs to be sufficiently high.

However, a phenomenon that the electronic barrier of the general insulating film having high dielectric constant is low is a problem which is necessarily generated because the band gap of the high dielectric substance is small. To solve this problem, for example, JP-A 2006-270102 (KOKAI) has been proposed. This JP-A 2006-270102 (KOKAI) has proposed that the electronic barrier is raised by depositing negative charges in the block layer. This publication has a feature in adding negative charges by annealing. However, sufficient charges can not be deposited in a stable condition only by annealing.

Sufficient charges which can satisfy a performance required by the NAND flash memory subsequent to the next generation can be deposited stably and as a final structure, a nonvolatile memory with the sufficiently high electronic barrier by the deposited negative charges has been demanded.

BRIEF SUMMARY OF THE INVENTION

The embodiments of the present invention provide a nonvolatile semiconductor memory which employs a block layer containing a uniform, sufficiently high electronic barrier having a high dielectric constant, in a stable condition and a manufacturing method thereof.

One embodiment provided a nonvolatile semiconductor memory comprising: a source area and a drain area provided on a semiconductor substrate with a gap which serves as a channel area; a first insulating layer formed on the channel area; a charge accumulating layer formed on the first insulating layer; a second insulating layer formed on the charge accumulating layer and having a first trivalent metallic oxide film supplied with an element a selected from a first substance group consisting of Tc, Re, Ru, Os, Rh, Ir, Pd, Pt, Co, Ni, W, Mo, Cr, Mn and Fe; and a control electrode formed on the second insulating layer.

A further embodiment provides a method of manufacturing a nonvolatile semiconductor memory, in which a source area and a drain area are provided on a semiconductor substrate with a gap which serves as a channel area, the method comprising: forming a first insulating layer on the channel area; forming a charge accumulating layer on the first insulating layer; forming a second insulating layer on the charge accumulating layer, the second insulating layer having a first trivalent metallic oxide film supplied with an element α selected from a first substance group consisting of Tc, Re, Ru, Os, Rh, Ir, Pd, Pt, Co, Ni, W, Mo, Cr, Mn and Fe; and forming a control electrode on the second insulating layer.

BRIEF DESCRIPTION OF THE SEVERAL VIEWS OF THE DRAWING

FIG. 7 is a diagram for explaining a level generated in a gap when high valence substance is added to oxide high dielectric substance material;

FIG. 12 is a sectional view of a Fin portion provided with a buried barrier film in the nonvolatile semiconductor memory of a modification of the second embodiment; and FIG. 13 is a sectional view of the Fin portion provided with the buried barrier film in the nonvolatile semiconductor memory as seen from the top, according to the modification of the second embodiment.

DETAILED DESCRIPTION OF THE INVENTION

Figure 1:
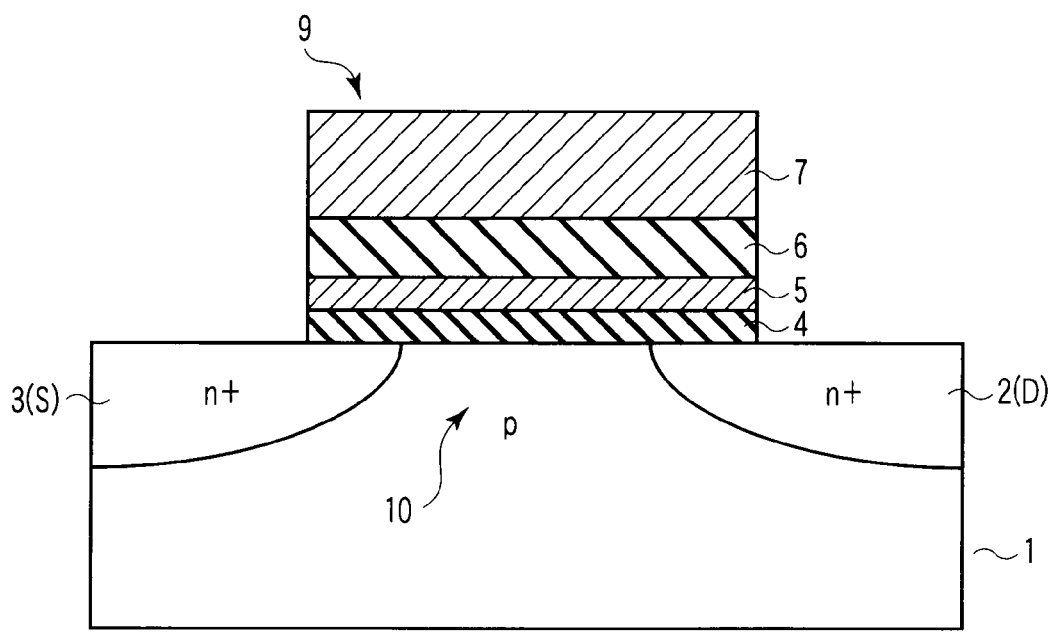
FIG. 1 is a sectional view showing a major portion of a memory cell according to a first embodiment.

Hereinafter, embodiments of the present invention will be described in detail with reference to the accompanying drawings.

First, the concept of the charge accumulation type memory of this embodiment will be described. Here, the configuration of the charge accumulation type memory of the first embodiment shown in FIG. 1 and described later will be described as an example. This charge accumulation type memory is formed such that a source area S3 and a drain area D2 are disposed on a semiconductor substrate 1 with a distance as a channel area 10 which serves as a current passage. A gate (gate multi-layer substance) 9 for controlling the operation of a memory is provided on this channel area 10. The gate multi-layer substance 9 is formed by laminating a first insulating layer (tunnel layer) 4, charge accumulation layer 5, second insulating layer (block layer) 6 and control electrode (writing/reading/erasing control electrode) 7 in this order on the silicon (Si) substrate 1.

The base material for use in this embodiment will be described.

First, the base material which constitutes the block layer will be described.

A condition concerning the block layer for providing the charge accumulation type memory with a more improved performance will be described. The entire thickness needs to be reduced in order to make a mutual interaction applied between adjoining memory cells when driven negligible. To achieve this, respective layers of the gate multi-layer substance 9, except the tunnel layer 4, are desired to be formed of substances having as high dielectric constant as possible. As for distribution of voltage at the time of writing/erasing, if the memory is constructed so that a relatively high voltage is applied to the tunnel layer while no voltage is applied to the trap layer and block layer if possible, it can be expected that writing/erasing is executed at a lower voltage, more rapidly and more effectively. For the above described reasons, it is effective that the dielectric constant of the tunnel film is set relatively low and the dielectric constant of the trap film and the block film is set relatively high.

Because charges are accumulated in the trap layer, the electronic barrier needs to be sufficiently high when seen from the trap layer side in order to improve the holding characteristic.

When the memory is erased, a large minus voltage is applied to the control electrode so as to allow electrons to flow out from the trap layer to the tunnel layer side (alternatively, holes are injected from the tunnel layer side). Unless the electronic barrier on the control electrode side is sufficiently high at this time, electrons are injected into the accumulation layer from the control electrode so that no data can be erased.

Thus, a block layer having a sufficiently high dielectric constant and a sufficiently high electronic barrier is needed; however, a block layer satisfying this condition at an excellent balance has not been obtained. The reason why the high dielectric constant and the high electronic barrier are not established at the same time is because the electronic barrier of a highly dielectric film generally tends to be low.

This is basically because the band gap of the high dielectric substance is firmly relevant to strength of coupling between metal and oxygen. If speaking of the principle intuitively, following can be mentioned.

The dielectric constant tends to be increased when vibration of ion is mild. This is because mild coupling of ions is a feature of the high dielectric substance. The mild coupling of metal and oxygen indicates an inclination that the band gap is further decreased because of weak mutual interaction. The reason why the high dielectric constant and the high electronic barrier cannot be satisfied sufficiently exists in the general characteristic of the high dielectric substance and some device is needed to make these compatible.

Trivalent metallic oxide such as $LaAlO_3$, $Al_2O_3$ and $La_2O_3$ has a sufficiently higher dielectric constant than silicon oxide. The dielectric constant may be 15 to 30. Further, the electronic barrier from conduction band of Si has a large value of 2.3 to 2.8 eV. However, this level is not sufficient for the electronic barrier for use. Contrary to this, this embodiment concerns a technology of providing an effectively high electronic barrier.

Tetravalent metallic oxide is not preferable for use as an electron block layer because it indicates an inclination that the electronic barrier is decreased although the dielectric constant can be increased. Bivalent metallic oxide indicates an inclination that the dielectric constant is decreased although the electronic barrier can be intensified and it is not preferable as the block layer. Thus, according to the embodiment of the present invention, tetravalent and bivalent metallic oxides are not used as the block layer. Of course, they can be used as additive.

The metallic oxide film material of this embodiment contains, as trivalent metal, at least one of aluminum (Al), scandium (Sc), yttrium (Y), lanthanum (La), indium (In), gallium (Ga) and Lantanoide elements M (M=Ce, Pr, Nd, Pm, Sm, Eu, Gd, Tb, Dy, Ho, Er, Tm, Yb, Lu).

$Al_2O_3$, $Sc_2O_3$, $Y_2O_3$, $La_2O_3$, $In_2O_3$, $M_2O_3$, $LaAlO_3$, $LaScO_3$, $LaGaO_3$, $LaInO_3$, $LaYO_3$, $YAlO_3$, $YScO_3$, $YGaO_3$, $YInO_3$, $MAlO_3$, $MScO_3$, $MGaO_3$, $MInO_3$, $MYO_3$, $Al_2Zr_2O_7$, $Al_2Hf_2O_7$, $Sc_2Zr_2O_7$, $Sc_2Hf_2O_7$, $Y_2Zr_2O_7$, $Y_2Hf_2O_7$, $La_2Zr_2O_7$, $La_2Hf_2O_7$, $In_2Zr_2O_7$, $In_2Hf_2O_7$, $Ga_2Zr_2O_7$, $Ga_2Hf_2O_7$, $M_2Zr_2O_7$, $M_2Hf_2O_7$ are typical substances. Here, M means the aforementioned Lantanoide element.

As a method for manufacturing a high dielectric film formed of metallic oxide having high dielectric constant such as trivalent metallic oxide, a currently typical film forming method can be used and, for example, chemical vapor deposition (CVD) method, atomic layer deposition (ALD) method, molecular beam epitaxy (MBE) method, sputtering method, vapor-deposition method, a method by combining irradiation of laser beam after coating and the like can be used.

Next, the additive will be described.

According to this embodiment, additive is added to the trivalent metallic oxide in order to impart a high electronic barrier. As a substance for substituting for trivalent metal, substance (high valence substance) having higher valence than the trivalent metallic oxide or substance (low valence substance) having lower valence than the trivalent metallic oxide is considered. Particularly, because according to this embodiment, bivalent substance is considered as substance having lower valence than the trivalent substance, the low valence substance and the bivalent substance coincide. Further, nitrogen, carbon and boron are considered as substance for substituting for oxygen. A charge accumulating mechanism in the case where additive is added to a high dielectric substance composed of trivalent metallic oxide will be described by classifying into cases. The charge accumulating mechanism is classified into a case 1 where an additive selected from high valence substances Tc, Re, Ru, Os, Rh, Ir, Pd, Pt, Co, Ni, W, Mo, Cr, Mn, Fe (hereinafter, these substances are called first substance group) is added and a case 2 where the additive selected from the first substance group and an additive selected from nitrogen, carbon, boron, bivalent substances Mg, Ca, Sr, Ba (hereinafter these substances are called second substance group) are added at the same time.

In the case 1, by adding an additive selected from the high valence substances Tc, Re, Ru, Os, Rh, Ir, Pd, Pt, Co, Ni, W, Mo, Cr, Mn, Fe (substance group 1) by an appropriate amount (an amount which induces no formation of band) into the high dielectric substance, a deep local level is generated inside the gap so as to trap electrons. A shown in FIG. 2 indicates this state. Because the level is very deep and exists locally, large energy is required for pulling out electrons. Thus, the block layer can be charged to negative side by depositing electrons on this level.

Next, improvement in performance by controlling distribution of additive will be described.

Figure 3:
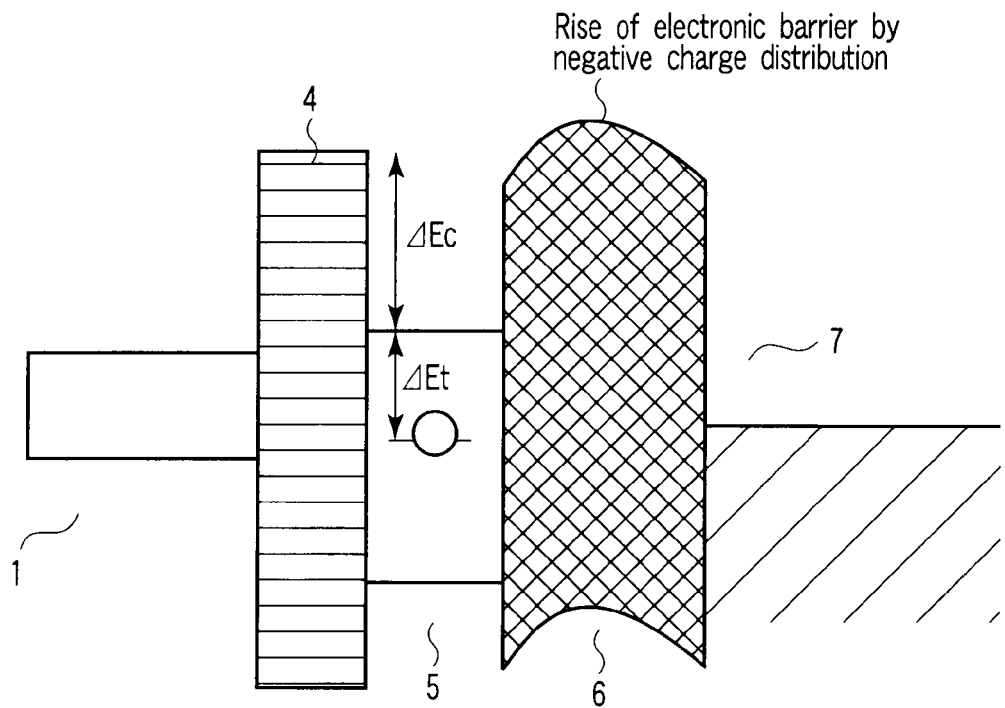
FIG. 3 is a schematic diagram showing a band lineup of a memory having a block layer according to the first embodiment.

The electronic barrier in the block layer area can be designed freely by controlling the distribution of high valence substance added to the trivalent metallic oxide. By distributing high valence substance uniformly on the entire block layer, electrons distributed within about 1 nm in the vicinity of an interface can escape to both sides when the trap layer or the electrode is selected. However, even if electrons flow out to the trap layer side, there is no problem in terms of principle if a state just after they flow out is adopted as a reference point of threshold. Even if electrons flow out to the electrode side, new electrons are injected into this level upon erasing so that a state in which the electronic barrier of the block layer is raised is gained, thereby providing no problem in terms of the principle. However, because injection of electrons into the block layer from the electrode occurs again when the memory is erased, reinjection time (which turns to delay time) of an amount by which electrons flow out to the electrode side is needed. If electrons flow out, there may occur a problem in the system if a deviation of the standard or a delay in erasing time exists. In this case, there is provided a structure in which no high valence substance is distributed in the vicinity of the interface. For example, as shown in FIG. 3, the high valence substance should be distributed densely on a plane in the vicinity of the center of the block layer while it is added sparsely to be lowered gradually toward the face (interface) of the control electrode 7 and the face (interface) of the trap layer 5. Because at this time, added high valance substance is located far from the electron and the trap layer, there is no possibility that electrons may flow out to both sides.

Figure 4:
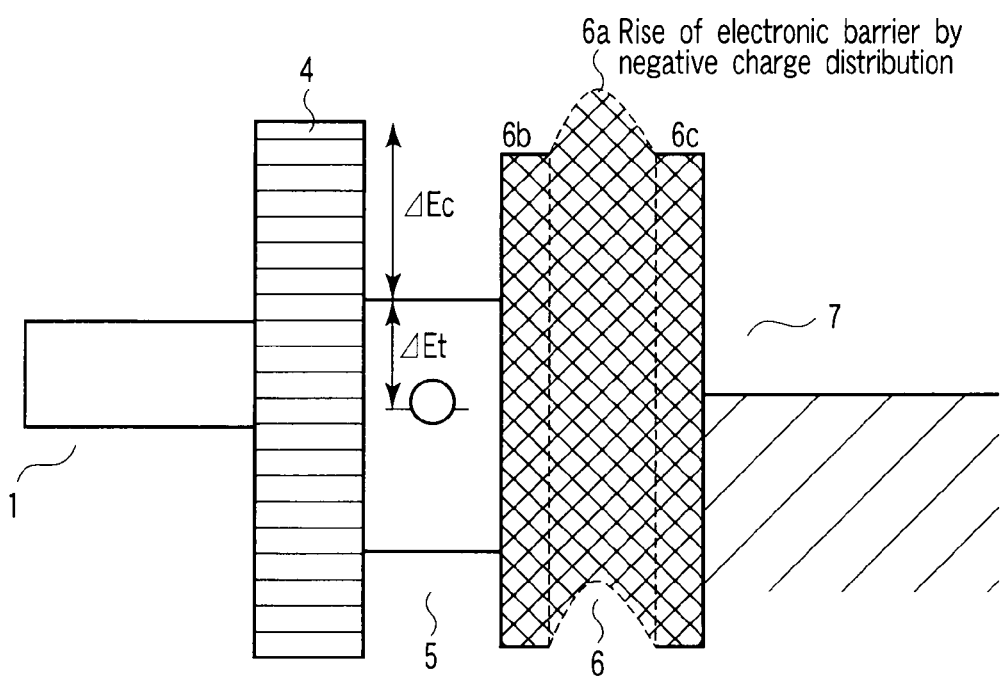
FIG. 4 is a schematic diagram showing a band lineup of a memory having a multi-layer structure block layer according to the second modification of the first embodiment.
Figure 5:
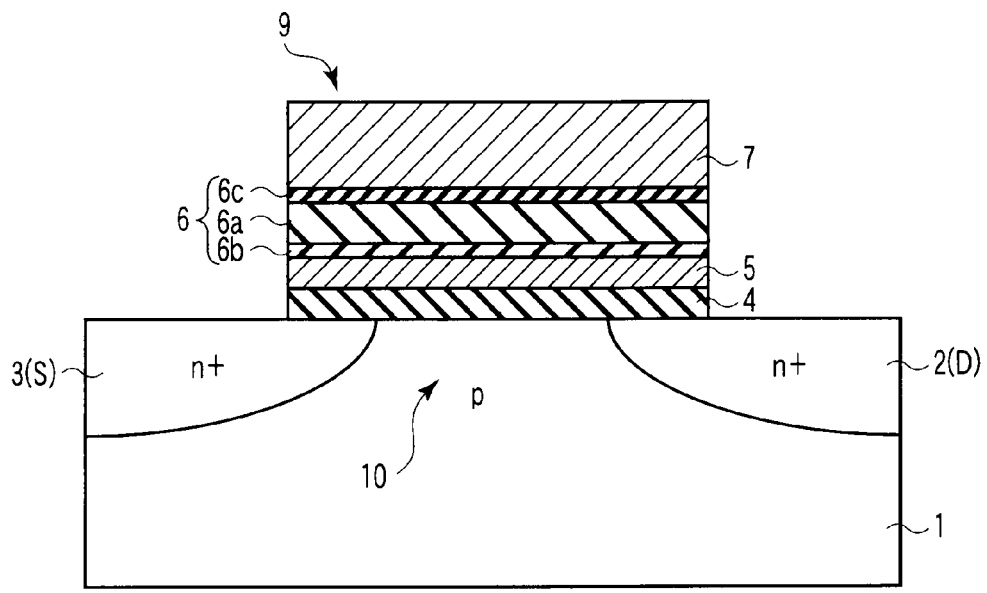
FIG. 5 is a sectional view showing an example of the configuration of a memory having a multi-layer structure block layer according to a second modification of the first embodiment.

Further, it can be considered that the barrier at a portion of additive layer is raised into a mountainous shape by building up a multi-layer structure composed of a layer with no additive (no additive layer) 6*b/a* layer with additive (additive layer) 6*a/a* layer with no additive (no additive layer) 6*c*:6*b*/6*a*/6*c* as shown in FIGS. 4 and 5. Here, there is no problem if the thickness of the layer with no additive is 1 nm. The block layer 6 may have mountainously skewed distribution (a distribution with a small amount on the interface with the trap layer 5→a large amount in the vicinity of the center of the block layer 6→a small amount in the vicinity of the interface of the electrode 7) such that the amount of additive is small in the vicinity of the interface while the amount of additive is large in the vicinity of the center. Although a case of adding the high valence substance is expressed as the case 1, control of the distribution is effective in the case 2 described below.

Next, the level upon addition of the high valence substance will be described. The case 1 will be explained in detail.

The basic configuration of this block layer exists in employing substance having a sufficiently higher dielectric constant than the tunnel layer as the base material and adding an appropriate amount of high valence substance to the base material. A localized level is created by adding high valence substance and electrons are introduced and fixed in the block film by trapping electrons in that level. The electronic barrier is charged negatively and raised, so that the high dielectric constant and the high electronic barrier are achieved at the same time.

The feature of a level generated in the high dielectric film supplied with an appropriate amount of the high valence substance is shown below.

The following feature has become evident from first-principles calculations in a development process of the block layer. That feature is that the level rises (or falls) corresponding to the quantity of electrons in the generated level as indicated with an arrow (1) in A shown in FIG. 2. If an excessive amount of electrons is introduced (injected) in the level, electrons within the same level repel each other so that energy level is raised (arrow (1) in A shown in FIG. 2). That amount is as large as 0.3 eV. This means that if electrons are accumulated on level a0, the energy level is raised to level a-1 as the accumulation amount is increased.

Here, the first-principles calculation will be described briefly. The first-principles calculation is an electronic state calculation according to density functional method using ultra-soft pseudo potential. The potential of each element (lanthanum, oxygen, etc) is already used in various forms, ensuring a high reliability. In this embodiment, a very high accuracy calculation is carried out.

Next, the case 2 will be described in detail. Here, a case where an additive selected from the aforementioned substance group 1 (Tc, Re, Ru, Os, Rh, Ir, Pd, Pt, Co, Ni, W, Mo, Cr, Mn, Fe) and an additive selected from substance group 2 (N, C, B, Mg, Ca, Sr, Ba) are added to trivalent metallic oxide will be described.

The first-principles calculation has made it evident that by adding nitrogen (the same thing happens in case of carbon, boron, Mg, Ca, Sr, Ba) to the high dielectric film supplied with an appropriate amount of additive (high valance substance) selected from the substance group 1, electronic state in the level created by adding the high valance substance can be controlled. That is, if nitrogen (or carbon, boron, low valence substance) is added, electrons existing in the level generated by adding the high valence substance can be dropped into valence band (composed of nitrogen and oxygen) and consequently, the quantity of electrons in the level is reduced, thereby the energy level being deviated in a deeper direction. The state of the drop of the energy level is indicated with an arrow (2) connecting A and B in FIG. 2.

By adding nitrogen (or carbon, boron, low valence substance) as well as the high valence substance at the same time, a more localized and deeper energy level can be used.

As the substance to be added together with the high valence substance, nitrogen, carbon, boron or low valence substance (bivalent metallic Mg, Ca, Sr, Ba) can be considered. Particularly, the bivalent metal can receive electrons inside of the valence band. To the contrary, in case of nitrogen, carbon and boron, a state appears within the band gap and electrons are received in that state. In case of the bivalent metal, it is expected that stabilization accompanied by electron movement is larger and further it is expected that the band gap is maintained, thereby providing a more excellent additive.

Next, a level generated in a gap of the trivalent metallic oxide will be described in detail.

The level generated in a gap when high valence substance is added to oxide high dielectric substance material such as Al, Sc, Y, La, Ga, In, Lantanoide (M) having trivalence will be described. Here, an example of calculation will be described with reference to FIGS. 6A, 6B and 7. FIG. 7 shows a difference in level in the case where Ti, Nb, Mo, Cr and Ru are added into trivalent metallic oxide, for example, $LaAlO_3$. In an actual calculation, calculations about a number of substances (Ti, Zr, Hf, V, Nb, Ta, Cr, Mo, W, Mn, Tc, Re, Fe, Ru, Os, Co, Rh, Ir, Ni, Pd, Pt) including the substances shown in the figure are carried out. It has been found as a result of the calculation that if substance having higher valence than trivalence (that is, hexavalent or higher substance) is added, a position of the level inside the gap by addition of a minute amount is generated at a position deep by 1.3 eV or more from the bottom of the conduction band (CB). That is, according to the calculation, when any one of Tc, Re, Ru, Os, Rh, Ir, Pd, Pt, Co, Ni, W, Mo, Cr, Mn, Fe is an additive, a sufficiently deep level is generated in the band gap. If electron is injected at this time, the electron is bound firmly so that negative charging is generated.

On the other hand, it has been found that in the case of tetravalent or pentavalent additive, even if a level is produced just below the conduction band like Ti or Nb shown in FIG. 7 and electron is injected, the electron escapes easily. If the additive is added, part of the generated level is filled with electrons while part thereof is empty.

Figure 6A:
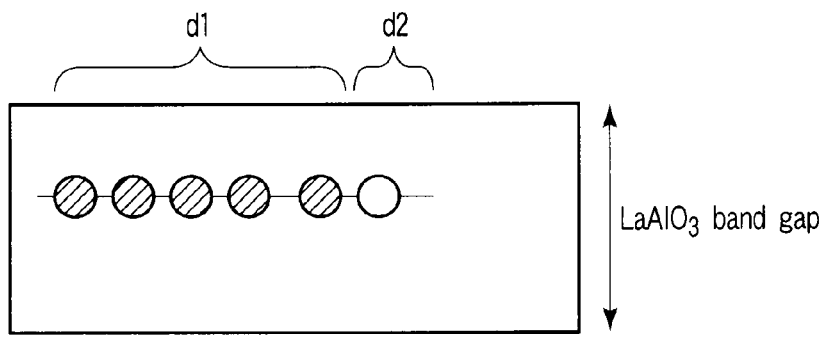
FIG. 6A is a diagram for explaining a level generated in a gap when high valence substance is added to oxide high dielectric substance material.
Figure 6B:
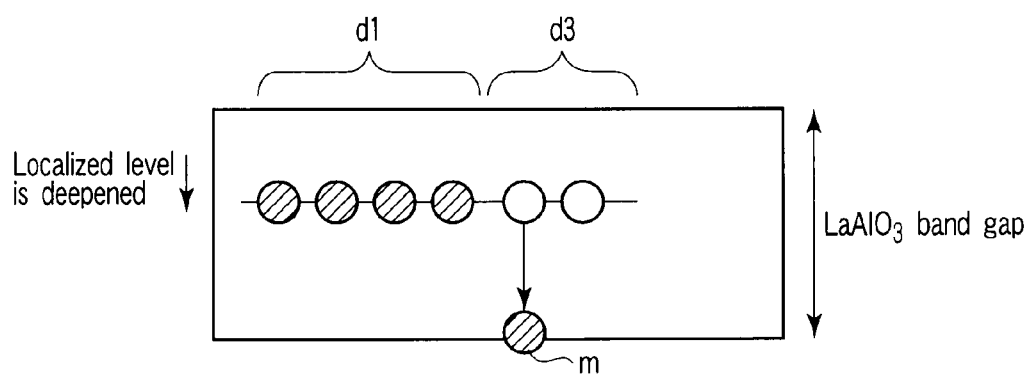
FIG. 6B is a diagram for explaining a level generated in a gap when nitrogen (or carbon, boron, low valence substance) is added together with high valence substance.

FIG. 6A shows a schematic diagram in the case where Ru is added into $LaAlO_3$. If electron is injected into this vacant level, minus charge is accumulated. By using this phenomenon, a block layer charged negatively can be designed. Particularly if a state in which electrons are loaded on the same level as energy level of work function of a control electrode or a deeper level can be achieved, it is considered to be a block layer charged negatively more stably.

FIG. 7 shows the band gap position of Si as reference of energy and additive having a level deeper than this gap position is more effective. The reason is that because a Si substrate is used, there is no fear that accumulated electron may escape on a level deeper than the band gap position of Si. Of course, this band gap position indicates an example using a silicon substrate and if other substrate is used, the band gap position of that substrate may be used as reference of energy.

If electron is injected, the level is raised and an inclination that the holding characteristic is deteriorated is noticed. In that case, by adding nitrogen at the same time (or the same thing occurs even if boron, carbon or low valence substance is added) as indicated in this embodiment (case 2), this deterioration can be blocked.

Figure 2:
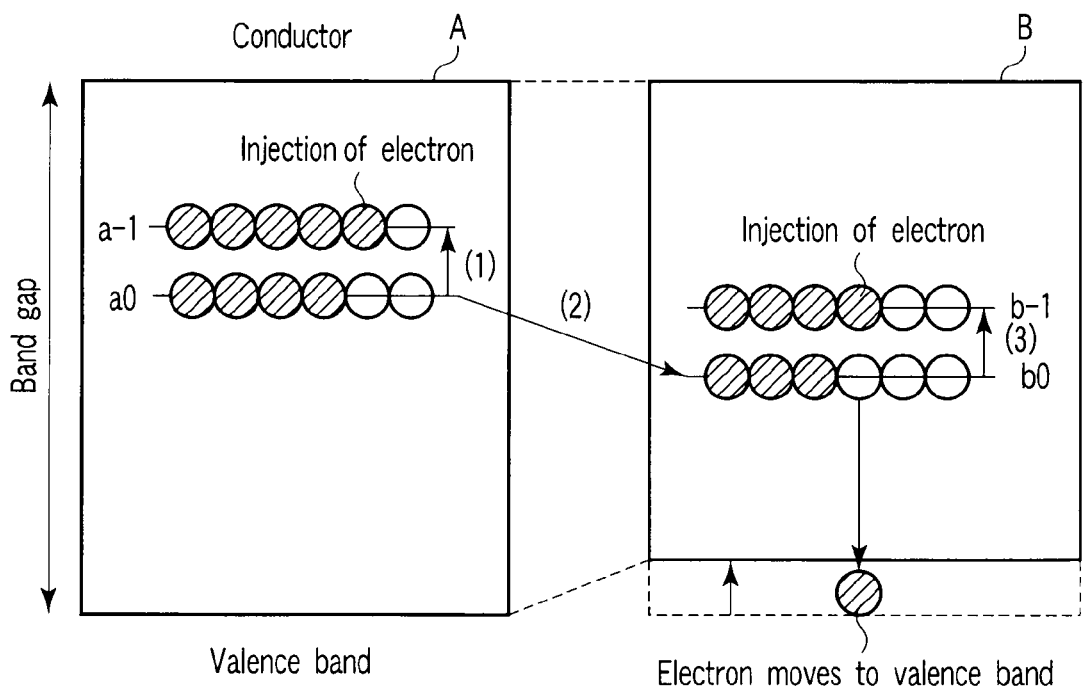
FIG. 2 is a diagram showing a change of trap level corresponding to a change of the quantity of electrons in a trap level supplied with high valence substance and a state in which electrons move from the trap level when nitrogen (or carbon, boron, low valence substance) is supplied at the same time.

By dropping electrons into the valence band by nitrogen as indicated by B in FIG. 2, the level can be deepened. If electrons are injected, the level is raised as indicated with an arrow (3) in B of FIG. 2 (from b0 state to b-1 state). This has an equal level to energy level before electrons are injected into a charge accumulation film supplied with no nitrogen (a0 state in A of FIG. 2). That is, it means that a0 state (no electron is injected) in A of FIG. 2 and b-1 state (electron is injected) have equal energy level.

Additive having high valence is substituted for trivalent substance (Al, Sc, Y, La, Ga, In Lantanoide elements) of the base material and has a feature in generating a vacant state (state in which electron can be added) in a band gap of an adding destination. Particularly, a substance having perovskite structure such as $LaAlO_3$ has the most prominent feature in that additive is added to a central position of oxygen octahedron called B site. At this time, a localized state in which electron can be introduced appears in $LaAlO_3$ gap. To meet this, a state in which existing plural dielectric materials are mixed simply, for example, $LaAlO_3$ and $WO_3$ are mixed simply is not considered. This is because a mere mixture of $LaAlO_3$ with $WO_3$ does not produce a localized state which allows electrons to be introduced into $LaAlO_3$.

Further, a substance can be narrowed down further from the viewpoint of stability. For example, Os, Ru, Ir, Rh and the like are available.

To create an oxygen defect in the tunnel layer $SiO_2$, an energy of 5.2 eV is needed for about half oxygen molecule ($\frac{1}{2}O_2$). If the trap layer is oxide, energy of 5 to 6 eV is needed to create the oxygen defect in the trap layer. Further, to create the oxygen defect in the block layer $LaAlO_3$, energy of 4.7 eV is needed for about half oxygen molecule. It is considered that an energy of 4.7 eV or more is needed to pull out oxygen form oxide. Of course, the tunnel layer and block layer need the same level of energy.

If stabilization energy for oxidizing additive metal (for example Ru) is sufficiently smaller than 4.7 eV, it can be expected that no oxygen defect is created by pulling out oxygen from each oxide film layer. Thus, metal additive having a small stabilization energy due to oxidation can be said to be more effective additive. As a corresponding additive, Os, Ru, Ir, Rh can be mentioned.

Additive for other high valence metals, usually, does not deprive each oxide film of oxygen because it is stable as oxide. However, if oxygen defect is generated in the block layer, other substance than Os, Ru, Ir, Rh has a possibility of generating the oxygen defect in other oxide film. In this case, it is permissible to adopt a manufacturing process which generates no excessive oxygen defect in the block layer by supplying an appropriate amount of oxygen upon formation of the block layer.

Next, the optimum amount of additive for addition will be described.

First, the lower limit of the addition amount will be described.

Here, the lower limit of the addition amount in the case where the additive is distributed at an area density of $\sigma[C/cm^2]$ in the block layer will be described. A change in the electronic barrier due to accumulated charge at this time is $V[V] \approx 1.8 \times 10^{-13} \times \sigma$. A change about by a digit can occur depending on the thickness or dielectric constant of each dielectric film. A range meaningful as the electronic barrier rise up amount V is effective if the area density on an interface is $1 \times 10^{12}$ cm$^{-2}$ or more because a change in V of about ±0.2 eV is obtained. Further, a sufficient electronic barrier rise up amount (±1.0 eV) can be secured if the area density is $5 \times 10^{12}$ cm$^{-2}$ or more. The lower limits indicated on the ordinate axis of FIGS. 8 and 9 mean these values.

Figure 8:
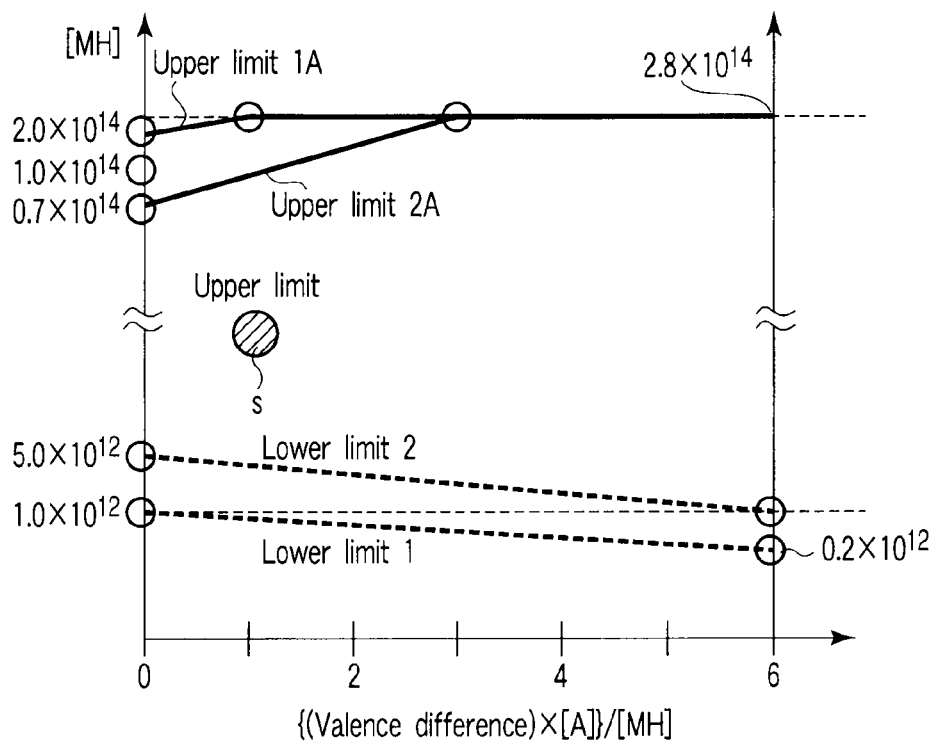
FIG. 8 is a diagram showing an optimum range of additive in a block layer supplied with high valence substance (Tc, Re, Ru, Os, Rh, Ir, Pd, Pt, Co, or Ni) and nitrogen (or carbon, boron, low valence substance)
Figure 9:
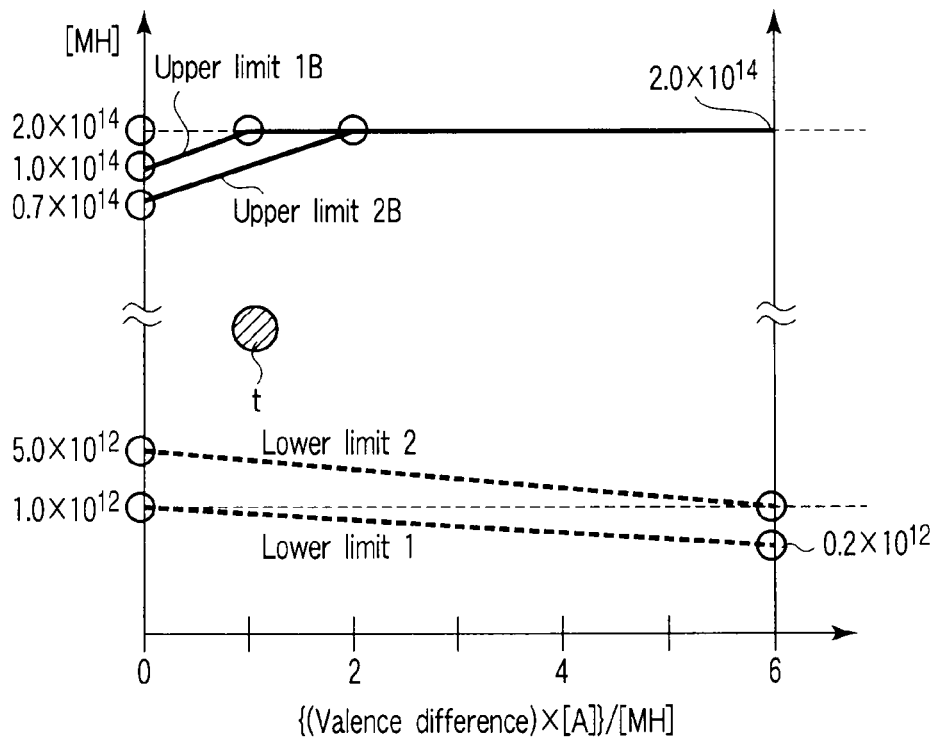
FIG. 9 is a diagram showing an optimum range of additive in a block layer supplied with high valence substance (W, Mo, Cr, Mn or Fe) and nitrogen (or carbon, boron, low valence substance)

FIGS. 8 and 9 indicate a range of the quantity of additive to be added to the block layer. Because the optimal range is changed depending on additive, the substance group 1 needs to be classified to two categories. FIG. 8 shows a case where Tc, Re, Ru, Os, Rh, Ir, Pd, Pt, Co, Ni are added as high valence substance and FIG. 9 shows a case where W, Mo, Cr, Mn, Fe are added as high valence substance.

As described in B of FIG. 2, in case 2, electrons are dropped into the valence band so that the level is deepened and further the level state is more localized, thereby the optimal range being changed. FIGS. 8 and 9 show this state.

The ordinate axis shown in FIGS. 8 and 9 shows the amount of high valence substance to be added [MH] and the abscissa axis indicates the amount of {valence difference K×[A]}/[MH] where nitrogen, carbon, boron or low valence substance amount is assumed to be [A]. The valence difference K is a valence difference with respect to oxygen in case of nitrogen, carbon and boron. In case of nitrogen, the valence difference K is 1 and the abscissa axis is [N]/[MH]. In case of carbon, the valence difference K is 2 and the abscissa axis is {2×[carbon]}/[MH]. In case of boron, the valence difference K is 3 and the abscissa axis is {3×[boron]}/[MH]. The valence difference K in the case of a low valence substance is a valence difference with respect to trivalence (Al, Sc, Y, La, Ga, In, Lantanoide substance of the base material). That is, in the case of bivalent substance (Ba, Sr, Ca, Mg and the like), [A]=[bivalent substance] and the valence difference is 1, and the abscissa axis indicates {1×[bivalent substance]}/[MH].

The lower limit of (case 2) will be described.

If nitrogen (or carbon, boron, low valence substance) is added together with high valence substance, the amount of charge deposited on each high valence substance is increased. That is, the lower limit is expanded. For example, if the amount of nitrogen and the amount of the high valence substance are equal, a position in which electron can invade is increased by one. That is, the state of d2 in FIG. 6A is changed to the state of d3 in FIG. 6B.

If the amount of nitrogen is twice the amount of the high valence substance, the position in which electron can invade is increased by two. The lower limit is a maximum number which electron can adopt and 6 is a reference value, $1 \times 10^{12}$ cm$^{-2}$/6 to $0.2 \times 10^{12}$ cm$^{-2}$. As for the value 6, if d orbit of additive is degenerated to trifold, trifold degeneration×two electrons=6 is meant because two electrons can invade into each orbit.

To secure a sufficient electronic barrier rise up amount, $5 \times 0.2 \times 10^{12}$ cm$^{-2}$ to $1.0 \times 10^{12}$ cm$^{-2}$, which is five times is preferable as described previously. These values are lower limits when the abscissa axis of FIGS. 8 and 9 indicates 6. FIG. 8 shows a result carried out by collinear approximation to the above-described lower limit concept. FIG. 9 shows the same condition for the lower limit.

In an area below the lower limit 1 shown in FIGS. 8 and 9, even if charges come out/in, the reference point of the threshold and delay time are never affected. Thus, the meaning of the no-added layer shown in FIGS. 4 and 5 indicates the area below the limit 1 of FIGS. 8 and 9. That is, when the area density of the first substance group (Tc, Re, Ru, Os, Rh, Ir, Pd, Pt, Co, Ni, W, Mo, Cr, Mn and Fe) is expressed as [MH], the area density of the second substance group (nitrogen, carbon, boron, Mg, Ca, Sr and Ba) is expressed as [A] and the valence difference K of the second substance group is expressed as K, K=1 in case of nitrogen, K=2 in case of carbon and K=3 in case of boron, and K=1 in case of Mg, Ca, Sr and Ba, and [MH], [A] and K are $0 \leq \{K \times [A]\}/[MH] \leq 6$ and $1.0 \times 10^{12}$ cm$^{-2}$–$1.3 \times 10^{11}$ cm$^{-2} \times \{K \times [A]\}/[MH] \geq [MH]$.

As for the meaning of no addition, when the area density of the first substance group is expressed as [MH], the area density of the second substance group is expressed as [A] and the valence difference K of the second substance group is expressed as K, K=1 in case of nitrogen, K=2 in case of carbon and K=3 in case of boron, K=1 in case of Mg, Ca, Sr and Ba and the [MH], the [A] and the K belong to a range of $0 \leq \{K \times [A]\}/[MH] \leq 6$ and $1.0 \times 10^{12}$ cm$^{-2}$–$1.3 \times 10^{11}$ cm$^{-2} \times \{K \times [A]\}/[MH] \geq [MH]$.

Next, the upper limit of the addition amount will be described.

The embodiment described later has a feature in that high valence additive is substituted for the metal element constituting the base oxide. That is, there is no condition in mixture ratio if the mixture of the oxide is handled. Instead of the mixture of the oxide, a charge accumulated material in which metallic additive substance such as W, Ru is substituted for metal Al in the base material of oxide LaAlO$_3$ is adopted. If this charge accumulated material is used, an upper limit exists in the quantity of the metallic additive substance.

In this embodiment, the added substance must not form any band within the gap of the dielectric substance. If any band is formed, charges are not localized but flow out from the block layer. Formation of the band is served as a reference for additive (Tc, Re, Ru, Os, Rh, Ir, Pd, Pt, Co, Ni) to invade into $2a \times 2a \times 2a$ unit structure where the lattice constant is assumed to be a with respect to the unit cell. This originates from the fact that energy level inherent in elements for producing the interior condition of the gap is apart from the energy level inherent in elements of the base material so that the mutual interaction with the base material is not large originally. Inversely, no band is formed unless any added element exists in the $2a \times 2a \times 2a$ unit structure. Thus, the upper limit is $2.0 \times 10^{14}$ cm$^{-2}$ as converted into area density. Further, if the oxide is a stable substance (W, Mo, Cr, Mn, Fe), charges can expand through mutual interaction with oxygen. Thus, there needs to be a state in which one additive or less exists in $2.5a \times 2.5a \times 2.5a$ unit structure. Therefore, the upper limit is $1.0 \times 10^{14}$ cm$^{-2}$ if expressed in terms of area density. These values are upper limit 1 (under mild condition) of the high valence substance amount [MH] when the abscissa axis of FIGS. 8 and 9 indicates 0. If charges are added, the level tends to rise, so that it approaches the level of the base material. To prevent the mutual interaction through the level inherent in the base material, a state in which one or less additive exists in the $3a \times 3a \times 3a$ unit structure is more preferable.

Thus, more preferably, the upper limit of this embodiment is $0.7 \times 10^{14}$ cm$^{-2}$ as expressed in terms of area density. This value is an upper limit 2 (stricter condition) of the high valence substance amount [MH] when the abscissa axis of FIG. 8, FIG. 9 indicates 0.

If nitrogen, carbon, boron or low valence substance is added to the trivalent metallic oxide, the quantity of charges held by the high valence substance is increased so that the charge accumulation level is deepened. The upper limit of the level can be a maximum value in which the levels are not connected thereby forming no band.

If the additive is Tc, Re, Ru, Os, Rh, Ir, Pd, Pt, Co, Ni, it has been found that the upper limit is that one or less additive exists in $1.5a \times 1.5a \times 1.5a$ unit structure when the deepest level is adopted according to a calculation. This upper limit is $2.8 \times 10^{14}$ cm$^{-2}$ as expressed in terms of area density. This upper limit is indicated as an addition amount to the maximum extent of FIG. 8. That is, this is a maximum value on the ordinate axis [MH].

Further, if the additive is W, Mo, Cr, Mn, Fe, it has been found that the upper limit is that one or less additive exists in $2a \times 2a \times 2a$ unit structure went the deepest level is adopted according to a calculation. The upper limit is $2.0 \times 10^{14}$ cm$^{-2}$ as expressed in term of area density. This value is indicated as an addition amount to the maximum extent of FIG. 9. That is, this is a maximum value of the ordinate axis [MH].

The upper limit is shown in FIGS. 8 and 9 with the amount of $\{K \times [A]\}/[MH]$ set on the abscissa axis like the lower limit. Here, the $\{K \times [A]\}/[MH]$ is an amount by which added nitrogen, carbon, boron, or low valence substance receives electrons. This is standardized to an amount per high valence substance amount [MH]. If this value is m, it means that m electrons are pulled out from a level created by the high valence substance. At this time, energy of the level drops and is localized so that the upper limit is expanded. In this case, m is an ordinary positive real number, for example, 0.95 or 1.75.

FIG. 8 indicates a case of [Ru]=$3.5 \times 10^{13}$ cm$^{-2}$ and [N]=$4.0 \times 10^{13}$ cm$^{-2}$. As shown in FIG. 8, although the upper limit in the initial condition is $2.0 \times 10^{14}$ cm$^{-2}$, addition of additive Tc, Re, Ru, Os, Rh, Ir, Pd, Pt, Co, Ni raises the upper limit to $2.8 \times 10^{14}$ cm$^{-2}$ under $\{K \times [A]\}/[MH]=1$. While the initial condition (0 on the abscissa axis) is $0.7 \times 10^{14}$ cm$^{-2}$, it is raised to $2.8 \times 10^{14}$ cm$^{-2}$ by additive under $\{K \times [A]\}/[MH]=3$.

This means that as the value on the abscissa axis is increased, the quantity of electrons dropping into the valence band increases so that an appearing level becomes localized and consequently metallization is not performed even if higher valence substance is applied. However, the localization is limited and $2.8 \times 10^{14}$ cm$^{-2}$ is a upper limit as converted into addition amount as described above, and thus, more high valence substance than the limit cannot be applied. If additive is applied more than the upper limit, the wave function between the additives overlap so as to generate a metallic behavior.

FIG. 9 shows a result of collinear approximation to the concept of the upper limit like FIG. 8. Additionally, this is expressed in the form of a following equation. FIG. 9 shows a case of [Cr]=$5.0 \times 10^{13}$ cm$^{-2}$ and [N]=$6.0 \times 10^{13}$ cm$^{-2}$.

If the additive is W, Mo, Cr, Mn or Fe, the initial condition (0 on the abscissa axis) of $1.0 \times 10^{14}$ cm$^{-2}$ is raised to $2.0 \times 10^{14}$ cm$^{-2}$ under $\{K \times [A]\}/[MH]=1$ as shown in FIG. 9. Alternatively, the initial condition of $0.7 \times 10^{14}$ cm$^{-2}$ is raised to $2.0 \times 10^{14}$ cm$^{-2}$ under $\{K \times [A]\}/[MH]=2$. FIG. 9 shows a result of collinear approximation to the concept of the upper limit described above.

The optimum value range shown in FIG. 8 is expressed by an equation.

FIG. 8 shows a case where the high valence substance is Tc, Re, Ru, Os, Rh, Ir, Pd, Pt, Co, Ni. These are classified as a first group (group A). In FIG. 8, the upper limit is provided with a subscript A as the group A. The range of the high valence substance amount [MH] is an interval from the upper limit 1A to the lower limit 1 of FIG. 8 as a wide range. Description of the meaning of each numeral is omitted because described previously. The range is indicated with equations.

The abscissa axis of FIG. 8 is in the range of $0 \leq \{K \times [A]\}/[MH] \leq 1$ and the ordinate axis is in the range of $1.0 \times 10^{12}$ cm$^{-2}$–$1.3 \times 10^{11}$ cm$^{-2} \times \{K \times [A]\}/[MH] \leq [MH] \leq 2.0 \times 10^{14}$ cm$^{-2}$+$0.8 \times 10^{14}$ cm$^{-2} \times \{K \times [A]\}/[MH]$. The additive in this range is effective.

Here, $1.0 \times 10^{12}$ cm$^{-2}$–$1.3 \times 10^{11}$ cm$^{-2} \times \{K \times [A]\}/[MH]$ is an equation which expresses the lower limit 1 and means a value higher than this lower limit 1. Further, $2.0 \times 10^{14}$ cm$^{-2}$+$0.8 \times 10^{14}$ cm$^{-2} \times \{K \times [A]\}/[MH]$ is an equation which expresses the upper limit 1A from 0 to 1 on the abscissa axis and means a value lower than this upper limit 1A.

The abscissa axis of FIG. 8 is in the range of $1 \leq \{K \times [A]\}/[MH] \leq 6$ and the ordinate axis is in the range of $1.0 \times 10^{12}$ cm$^{-2}$–$1.3 \times 10^{11}$ cm$^{-2} \times \{K \times [A]\}/[MH] \leq [MH] \leq 2.8 \times 10^{14}$ cm$^{-2}$. The additive in this range is effective.

Here, as for the respective equations, the equation of the lower limit 1 is expressed as $1.0 \times 10^{12}$ cm$^{-2}$–$1.3 \times 10^{11}$ cm$^{-2} \times \{K \times [A]\}/[MH]$ or the equation of the upper limit 1A is expressed as $2.8 \times 10^{14}$ cm$^{-2}$. The above-described addition amount range indicates an effective, largest range shown in FIG. 8.

A further stable memory operation is enabled in an interval from the upper limit 2A to the lower limit 2. Description of respective numerals in the figure is omitted because they have been already mentioned. The range of addition amount is expressed clearly with equations here.

The abscissa axis of FIG. 8 is in the range of $0 \leq \{K \times [A]\}/[MH] \leq 3$ and the ordinate axis is in the range of $5.0 \times 10^{12}$ cm$^{-2}$–$6.7 \times 10^{11}$ cm$^{-2} \times \{K \times [A]\}/[MH] \leq [MH] \leq 0.7 \times 10^{14}$ cm$^{-2}$+$0.7 \times 10^{14}$ cm$^{-2} \times \{K \times [A]\}/[MH]$. The additive in this range is effective.

Here, $5.0 \times 10^{12}$ cm$^{-2}$–$6.7 \times 10^{11}$ cm$^{-2} \times \{K \times [A]\}/[MH]$ is an equation which expresses the lower limit 2 and means a value higher than this lower limit 2. Further, $0.7 \times 10^{14}$ cm$^{-2}$+$0.7 \times 10^{14}$ cm$^{-2} \times \{K \times [A]\}/[MH]$ is an equation which expresses the upper limit 2A from 0 to 3 on the abscissa axis and means a value lower than this upper limit 2A.

The abscissa axis of FIG. 8 is in the range of $3 \leq \{K \times [A]\}/[MH] \leq 6$ and the ordinate axis is in the range of $5.0 \times 10^{12}$ cm$^{-2}$–$6.7 \times 10^{11}$ cm$^{-2} \times \{K \times [A]\}/[MH] \leq [MH] \leq 2.8 \times 10^{14}$ cm$^{-2}$. The additive in this range is effective.

Here, as for the respective equations, the equation of the lower limit 2 is expressed as $5.0 \times 10^{12}$ cm$^{-2}$–$6.7 \times 10^{11}$ cm$^{-2} \times \{K \times [A]\}/[MH]$ or the equation of the upper limit 2A is expressed as $2.8 \times 10^{14}$ cm$^{-2}$. The range of the above described addition amount indicates effective, strictest range which allows the addition, shown in FIG. 8.

Next, the range of the optimum values shown in FIG. 9 is expressed with equations.

FIG. 9 shows a case where the high valence substance is W, Mo, Cr, Mn or Fe. These are classified as a second group (group B). In FIG. 9, the upper limit is provided with a subscript B as the group B. The range is an interval from the upper limit 1B to the lower limit 1 of FIG. 9 as a wide range. Description of the meaning of each numeral is omitted because described previously. The range of addition amount is indicated with equations.

The abscissa axis of FIG. 9 is in the range of $0 \leq \{K \times [A]\}/[MH] \leq 1$ and the ordinate axis is in the range of $1.0 \times 10^{12}$ cm$^{-2}$–$1.3 \times 10^{11}$ cm$^{-2} \times \{K \times [A]\}/[MH] \leq [MH] \leq 1.0 \times 10^{14}$ cm$^{-2}$+$1.0 \times 10^{14}$ cm$^{-2} \times \{K \times [A]\}/[MH]$. The additive in this range is effective. Here, $1.0 \times 10^{12}$ cm$^{-2}$–$1.3 \times 10^{11}$ cm$^{-2} \times \{K \times [A]\}/[MH]$ is an equation which expresses the lower limit 1 and means a value higher than this lower limit 1. Further, $1.0 \times 10^{14}$ cm$^{-2}$+$1.0 \times 10^{14}$ cm$^{-2} \times \{K \times [A]\}/[MH]$ is an equation which expresses the upper limit 1B from 0 to 1 on the abscissa axis and means a value lower than this upper limit 1B.

The abscissa axis of FIG. 9 is in the range of $1 \leq \{K \times [A]\}/[MH] \leq 6$ and the ordinate axis is in the range of $1.0 \times 10^{12}$ cm$^{-2}$–$1.3 \times 10^{11}$ cm$^{-2} \times \{K \times [A]\}/[MH] \leq [MH] \leq \sim 2.0 \times 10^{14}$ cm$^{-2}$. The additive in this range is effective. Here, as for the respective equations, the equation of the lower limit 1 is expressed as $1.0 \times 10^{12}$ cm$^{-2}$–$1.3 \times 10^{11}$ cm$^{-2} \times \{K \times [A]\}/[MH]$ or the equation of the upper limit 1B is expressed as $2.0 \times 10^{14}$ cm$^{-2}$. The above-described addition amount range indicates an effective, largest range shown in FIG. 9.

A further stable memory operation is enabled in an interval from the upper limit 2B to the lower limit 2. Description of respective numerals in the figure is omitted because they have been already mentioned. The range of addition amount is expressed clearly with equations here.

The abscissa axis of FIG. 9 is in the range of $0 \leq \{K \times [A]\}/[MH] \leq 2$ and the ordinate axis is in the range of $5.0 \times 10^{12}$ cm$^{-2}$–$6.7 \times 10^{11}$ cm$^{-2} \times \{K \times [A]\}/[MH] \leq [MH] \leq 0.7 \times 10^{14}$ cm$^{-2}$+$6.5 \times 10^{13}$ cm$^{-2} \times \{K \times [A]\}/[MH]$. The additive in this range is effective.

Here, $5.0 \times 10^{12}$ cm$^{-2}$–$6.7 \times 10^{11}$ cm$^{-2} \times \{K \times [A]\}/[MH]$ is an equation which expresses the lower limit 2 and means a value higher than this lower limit 2. Further, $0.7 \times 10^{14}$ cm$^{-2}$+$6.5 \times 10^{13}$ cm$^{-2} \times \{K \times [A]\}/[MH]$ is an equation which expresses the upper limit 2B from 0 to 2 on the abscissa axis and means a value lower than this upper limit 2B.

The abscissa axis of FIG. 9 is in the range of $2 \leq \{K \times [A]\}/[MH] \leq 6$ and the ordinate axis is in the range of $5.0 \times 10^{12}$ cm$^{-2}$–$6.7 \times 10^{11}$ cm$^{-2} \times \{K \times [A]\}/[MH] \leq [MH] \leq 2.0 \times 10^{14}$ cm$^{-2}$. Here, as for the respective equations, the equation of the lower limit 2 is expressed as $5.0 \times 10^{12}$ cm$^{-2}$–$6.7 \times 10^{11}$ cm$^{-2} \times \{K \times [A]\}/[MH]$ or the equation of the upper limit 2B is expressed as $2.0 \times 10^{14}$ cm$^{-2}$. The range of the above described addition amount indicates effective, strictest range which allows the addition, shown in FIG. 9.

Next, the relationship between the high valence additive and the total number of electrons will be described.

Assume that the total number of electrons to be added to a level appearing inside the gap in the block layer is [e] when the aforementioned high valence additive (Tc, Re, Ru, Os, Rh, Ir, Pd, Pt, Co, Ni, W, Mo, Cr, Mn or Fe) is added. The total addition amount of nitrogen or low valence substance is assumed to be [B] and as for the valence difference K, K=1 (case of nitrogen), K=2 (case of carbon), K=3 (case of boron) and K=1 (case of bivalent substance) are assumed. Here, the number of electrons which can receive nitrogen (or carbon, boron, low valence substance) is $K \times [B]$ and preferably, $0 \leq \{K \times [B]\}/[e] \leq 1.0$.

If nitrogen (or carbon, boron, low valence substance) is added together with high valence substance to substance whose base metal is trivalent, when this ratio exceeds 1, the oxygen defect needs to be generated corresponding to an exceeding amount. Consequently, there occur dangers of metallization and of base oxide being destroyed, thereby dropping long-term reliability. As a result, an upper limit is generated in the addition amount of nitrogen, carbon, boron or low valence substance. That is, if any one of these substances is excessively larger than the high valence substance addition amount, the oxygen defect occurs, which is not preferable. Thus, a preferred range is $0 \leq \{K \times [B]\}/[e] \leq 1.0$ described previously.

The above-described matter will be described further in detail by dividing to the addition amount of the high valence substance and number of introduced electrons. The amount to be added of the high valence additive (Tc, Re, Ru, Os, Rh, Ir, Pd, Pt, Co, Ni, W, Mo, Cr, Mn or Fe) is assumed to be [A]. The total addition amount of nitrogen, carbon, boron or low valence substance is assumed to be [B]. Here, the valence differences K, L are defined as follows.

The valence difference K corresponds to the number of electron holes formed at the vertex of the valence band (that is, number of electrons which can be received) while K=1 (case of nitrogen), K=2 (case of carbon), K=3 (case of boron) and K=1 (case of bivalent low valence substance). K×[B] is the number of electrons which nitrogen can receive (or carbon, boron, low valence substance).

L=number of outermost electrons of high valence substance–3 is L=6–3=3 in case of Cr and L=8–3=5 in case of Ru. The valence difference L is the number of electrons per high valence substance possessed in the level by the high valence substance. Because the metal of the base material oxide is trivalent substance, it comes that electrons remain in excess by just a difference from the trivalence so that they are deposited in a level. Then L×[A] is the number of electrons which can be discharged, existing in the level created by the high valence substance.

A ratio between the K×[B] and L×[A] is preferred to be between 0 and 1. If this ratio exceeds 1, the oxygen defects need to be created by an exceeding amount, thereby providing a danger of metallization and of base material oxide being destroyed to reduce the long-term reliability. Consequently, the upper limit appears in the addition amount (introduction amount) of nitrogen, carbon, boron, or low valence substance. That is, if any one of these materials is extremely larger than the addition amount of the high valence substance, the oxygen defect occurs. Thus, $0 \leq \{K \times [B]\}/\{L \times [A]\} \leq 1.0$ is preferable.

As indicated in the following embodiments, in case of $[N] \approx [Ru]$, $\{K \times [B]\}/\{L \times [A]\} = [N]/\{5 \times [Ru]\} \approx 0.2$, indicating that improvement in charge holding characteristic is remarkable. The number of electrons in a level generated by Ru is 5. Because nitrogen is added by a substantially equal amount, one electron drops in the valence band, so that four electrons are deposited in the level. With this state, charges are neutral and consequently, electron and positive holes can be injected therein. Here, the valence of L of the high valence substance for use in this embodiment is summarized as follows. L=3 (case of Cr, Mo, W), L=4 (case of Mn, Tc, Re), L=5 (case of Fe, Ru, Os), L=6 (case of Co, Rh, Ir), L=7 (case of Ni, Pd, Pt).

Next, the feature of the embodiments of the present invention will be described.

According to the technique proposed in the patent document 1 as a conventional art, even if negative charge is introduced into the block layer by annealing, deposited negative charge is dissipated when heat process included in the manufacturing process is executed, so that it is difficult to raise the electronic barrier in a final structure sufficiently. Further, because distribution controllability about charge amount and charge position cannot be secured, the size of the electronic barrier is distributed. Phenomenon in which the barrier characteristic is excellent in one memory cell but not excellent in other memory cell occurs, thereby not securing the reliability of a product sufficiently.

To this end, this embodiment has a configuration of, first creating a sufficient amount of electron trap site artificially by adding additive to the base material and second, generating action of depositing electrons in the created trap site. The kinds of the additives to be added for this configuration, combination thereof and addition amount are specified. By using this configuration, a sufficient charge amount can be secured and once electrons are deposited, a block layer having an excellent characteristic which blocks electrons from escaping can be created. With this configuration, even if various film forming processes are passed later, the entire system exists stably, so that the large electronic barrier can be maintained stably by trapping electrons. Further, because the additive is controlled, it can be added while maintaining excellent controllability on the quantity and position.

Next, the first embodiment of the present invention will be described specifically.

FIG. 1 is a sectional view showing the major portions of the cell of the nonvolatile semiconductor memory of the first embodiment. FIG. 3 is a diagram showing schematically a band structure of a multi-layer film constituted of a first insulating layer (tunnel layer), charge accumulating layer, second insulating layer (block layer) and control electrode (writing/reading/erasing control electrode) formed on a silicon (Si) substrate. Here, the block layer is charged negatively and its electronic barrier is raised as compared with before charging.

The nonvolatile semiconductor memory (charge accumulation type memory) of the first embodiment is formed on a P type semiconductor substrate 1 such that an N type source area (S) 3 and a drain area (D) 2 are disposed with a distance as the channel area 10 which serves as a current passage. A gate (gate multi-layer substance) 9 for controlling the memory operation (writing, reading and erasing) is provided on this channel area 10. The gate multi-layer substance 9 is formed by laying a first tunnel layer (first insulating layer) 4, charge accumulation layer 5, block layer (second insulating layer) 6 and control electrode (writing/reading/erasing control electrode) 7 in this order on the silicon (Si) substrate 1. A distance between the source area 3 and the drain area 2 (channel length) is a distance which is set appropriately based on the design specification of the memory, and serves as the channel area 10. Hereinafter, the detail of the respective layers will be described.

First, the tunnel layer 4 of this embodiment will be described in detail.

Both ends of this tunnel layer 4 are formed on the channel area 10 such that they overlap the source area 3 and the drain area 2. This tunnel layer 4 is formed of a silicon oxide film having a low dielectric constant and its thickness is 0.5 nm to 5 nm. This embodiment adopts a thickness of 2.4 nm. This tunnel layer 4 has a low dielectric constant for maintaining the barrier and is constituted not only by a single $SiO_2$ film but also by a silicon oxynitride film, silicon nitride film or multi-layer film thereof. For example, it may be multiple films of $SiO_2/Si_3N_4/SiO_2$ or the like.

A conventional floating gate (FG) type memory cannot be operated normally if the tunnel layer is formed in a thickness of 7 nm or less. The tunnel layer 4 of this embodiment can be formed in a thickness of 5 nm or less by adopting the discrete charge accumulating layer 5, thereby achieving a thin tunnel layer.

Next, the charge accumulating layer 5 of this embodiment will be described.

This charge accumulating layer 5 can be operated at a lower voltage by adopting the high dielectric material. The effect by the dropped voltage reduces the voltage applied to the block layer 6, thereby effectively preventing injection of electrons from the electrode side when memorized data is erased. That is, the injection of electrons on the electrode side is suppressed. Further, because allocation of voltage applied to the tunnel film is increased, the tunnel layer 4 can be formed thinner.

In this embodiment, high valence substance is added into the block layer 6 and the charge accumulating layer 5 can be formed in the same way. That is, by adding the same substance as the block layer 6 to the charge accumulating layer 5, a high density electron trap is achieved. By adopting substance having a higher dielectric constant than the block layer 6, the same substance as the block layer 6 is added into that substance.

A difference between suitability to the block layer 6 and suitability to the charge accumulating layer 5 depends on mainly dielectric constant and the size of the electronic barrier. If a structure which makes it difficult for electron to come out once it is trapped can be achieved according to the manufacturing method of this embodiment, the block layer 6 is suitable. This can be formed with substance having a relatively large electronic barrier. Conversely, substance having a relatively small electronic barrier is effective as the charge accumulating layer 5.

Because according to this embodiment, substantially all applied voltage can be applied to the tunnel layer 4 by using a high dielectric material for the block layer 6, a voltage necessary for the memory operation can be reduced sufficiently to achieve low voltage drive. Further, lower voltage operation is enabled by adopting high dielectric material for the charge accumulating layer 5. The effect of this reduced voltage also reduces a voltage applied to the block layer 6, thereby effectively preventing injection of electrons from the electrode 7 side when memorized data is erased. That is, injection of electrons from the electrode is suppressed.

Further, as shown in FIG. 3, the electron trap level is formed within the block layer 6 and by injecting electrons therein, the electronic barrier is raised, thereby preventing injection of electrons from the electrode side when memorized data is erased.

When a predetermined voltage is applied to the control electrode 7 and the drain area 2, electron having passed the tunnel layer 4 is trapped by the charge accumulating layer 5. In this embodiment, a SiN film (5 nm thick) is used as the charge accumulating layer 5. For example, the film forming method for the charge accumulating layer 5 is realized by forming a silicon film according to the CVD method and executing heat treatment in an atmosphere of nitrogen/Ar mixture gas. In this embodiment, trap density is controlled by controlling the quantity of nitrogen. After the film is formed, it is annealed in an atmosphere of nitrogen/oxygen mixture.

The block layer 6 of this embodiment is formed of $LaAlO_3$ (7 nm thick) having a dielectric constant of 20. According to that film forming method, $RuO_2$ target is sputtered together with $LaAlO_3$ target at the same time in an atmosphere of oxygen/nitrogen/Ar mixture gas so as to add Ru. Nitrogen is added into the film by controlling the quantity of nitrogen. After the film is formed, it is annealed in an atmosphere of nitrogen/oxygen mixture.

According to this embodiment, the amount of Ru applied to form the film is $3.5 \times 10^{13}$ cm$^{-2}$ in terms of area density, which enables a larger negative charge to be applied. The amount of added nitrogen was about $4 \times 10^{13}$ cm$^{-2}$. At this time, Ru forms a level in $LaAlO_3$ gap and the level is filled with electrons about by 67%. By adding a substantially equal amount of nitrogen as Ru amount, two electronic states in the level are vacant (see d3 in FIG. 6B). By applying a highly negative voltage to the memory electrode, electrons are introduced into the electron vacant position. A negatively charged block layer is produced in this way.

The memory produced in this way has a remarkably improved performance in terms of erasing speed as compared with a case of using $LaAlO_3$ supplied with no additive as the block layer. This is considered to be because high speed erasing is enabled as writing of electrons from the electrode side is eliminated even if the erasing voltage is raised.

As described above, the nonvolatile semiconductor memory of the first embodiment has an improved charge holding characteristic because the blocking characteristic against accumulated charges is improved. Further, the electronic barrier to the memory electrode side is enlarged so as to avoid injection of electrons from the memory electrode. As a result, the erasing speed is improved extremely.

Next, a first modification of the first embodiment will be described.

The above-described conventional silicon nitride film cannot allow holes to be trapped or electrons to be pulled out excessively. Contrary to this, by using the charge accumulating layer obtained by adding additive to the high dielectric substance, electrons in the level can be pulled out. At this time, a large threshold change width by pulling out electrons excessively can be secured and at the same time high speed erasing is enabled.

According to the first modification, by using a $TiO_2$ film (6 nm thick) having a high dielectric constant of 100 as the charge accumulating layer 5, Ru and nitrogen were added therein just like the block layer. As for the film forming method, by heating the silicon substrate 1, $TiO_2$ target and $RuO_2$ target were sputtered at the same time in an atmosphere of oxygen/nitrogen/Ar mixture gas so as to add Ru when the charge accumulating layer 5 is formed. In the meantime, by controlling the amount of nitrogen, nitrogen was added into the film. After the film was formed, it was annealed in an atmosphere of nitrogen/oxygen mixture.

If the dielectric constant of the charge accumulating layer 5 is set higher than the dielectric constant of the block layer 6, a relative position of energy level with respect to the same additive is determined, so that the level in the charge accumulating layer 5 appears at a lower position. As a result, electrons accumulated in the charge accumulating layer 5 never flow to the block layer side. Further, in the charge accumulating layer 5, the energy level for charge accumulation exists at a very deep position. Thus, charge leakage in the charge holding state is suppressed largely as compared with the silicon nitride film.

Next, a second modification of the first embodiment will be described.

FIG. 5 is a sectional view showing major portions of the memory cell according to the second modification. FIG. 4 is a diagram showing schematically the band structure of the gate multi-layer substance 9 constructed on the silicon substrate 1. The gate multi-layer substance 9 is constituted of the tunnel layer (first insulating layer) 4, charge accumulating layer 5, block layer (second insulating layer) 6 and control electrode (writing/reading/erasing control electrode) 7, formed on the silicon substrate 1.

The block layer 6 of the second modification is constituted of three layers, i.e., second block layer 6b, first block layer 6a and third block layer 6c, each formed of insulating body. The second block layer 6b and the third block layer 6c are not supplied with any additive. Of the block layers 6b, 6c provided on both sides of the first block layer 6a, only one of them may be formed or they may be formed in multiple layers. The second and third block layers 6b, 6c supplied with no additive are provided to prevent substance added into the first block layer 6a from being diffused to the charge accumulating layer 5 side or the control electrode 7 side. Existence of these second, third block layers 6b, 6c can prevent outgoing and incoming of electrons (escape of electrons accumulated in the block layer to the charge accumulating layer or the electrode) wastefully when holding data, reading the memory and erasing the memory. Because the operating speed is changed or the operation characteristic deviates due to a difference in outgoing and incoming of electrons, this is very useful for preventing these phenomenon. Further, by adopting the control electrode 7 having a large work function, the electronic barrier can be raised. The second modification uses TaN as a memory electrode.

A third modification of the first embodiment will be described.

As the block layer 6 of the third modification, $LaAlO_3$ (7 nm thick) having a dielectric constant of 20 is used. For example, this block layer 6 is supplied with Ru by sputtering the $LaAlO_3$ target and the $RuO_2$ target in an atmosphere of oxygen/Ar mixture gas at the same time so as to form the film. Only Ru is supplied without supplying nitrogen here. After the film is formed, it is annealed in an atmosphere of oxygen.

In this embodiment, the amount of Ru added to form the film is $3.5 \times 10^{13}$ cm$^{-2}$ in terms of area density, which meets the first embodiment. In this case also, a large negative charge can be applied. At this time, Ru forms a level in $LaAlO_3$ gap and the level is filled with electrons by about 83%. An electronic state in the level is vacant (FIG. 9(A)). By applying a high negative voltage to the memory electrode, electron is introduced into this electron vacant position. A negatively charged block layer is formed in this way.

A memory produced in this way has an extremely improved characteristic in terms of erasing speed as compared with a case of using $LaAlO_3$ supplied with no additive as a block layer. This is considered to be because high speed erasing is enabled as writing of electron form the electrode side is eliminated by raising the erasing voltage.

Although Ru and nitrogen are supplied at the same time in the first embodiment, only Ru is added in the third modification. As a result, substantially equal excellent characteristic was obtained. In this third modification, the electron level is somewhat raised because only Ru is added. Consequently, it has been found that voltage resistance to a high voltage is dropped by about 10% as compared with a case where nitrogen is added. However, the voltage resistance is much higher than a conventional block layer formed of LAO without any additive, and a very high performance cell can be obtained as the memory cell.

According to the first embodiment and the first to third modifications, as described above, the memory holding characteristic can be improved and the high speed and low driving voltage operation can be performed by using a negatively charged block layer.

Next, a second embodiment of the present invention will be described.

Figure 10:
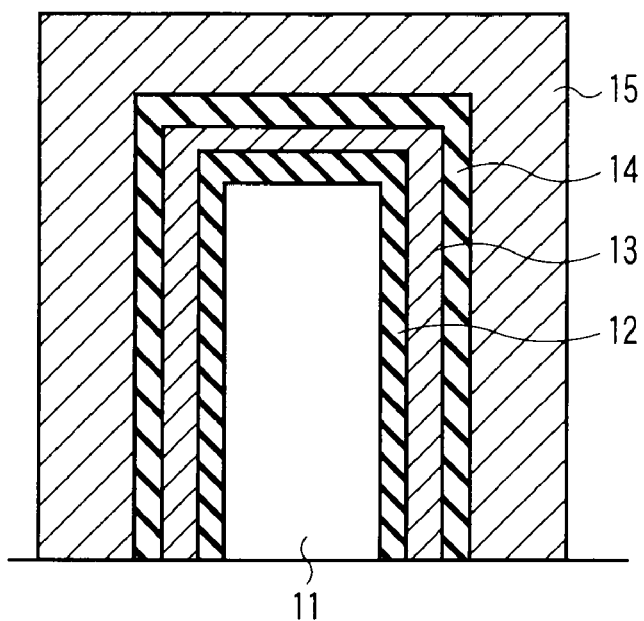
FIG. 10 is a sectional view of a nonvolatile semiconductor memory according to a second embodiment as seen from the sideway of the MONOS memory structure using FinFET.
Figure 11:
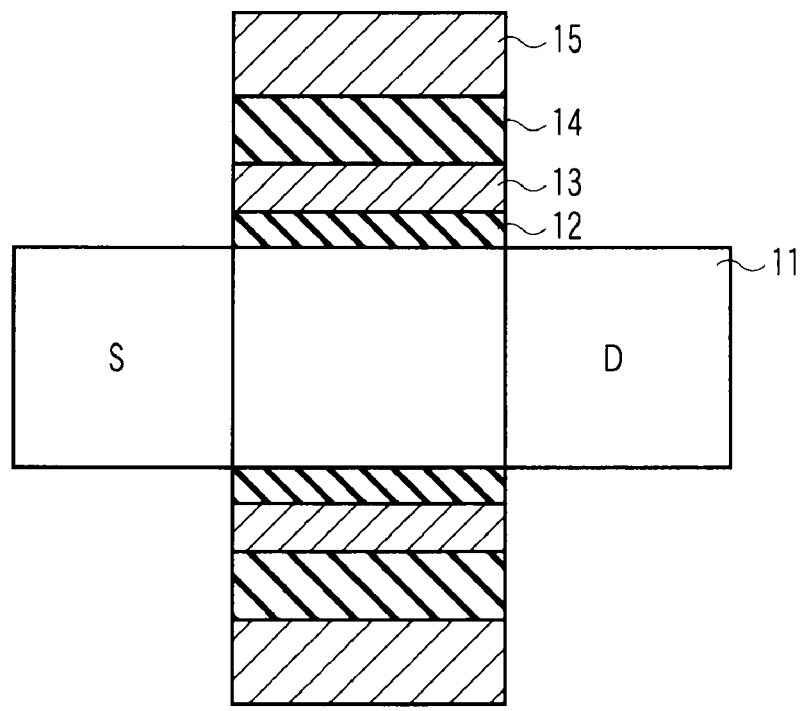
FIG. 11 is a diagram of the nonvolatile semiconductor memory according to the second embodiment as seen from top of the MONOS memory structure using FinFET.

The nonvolatile semiconductor memory of the second embodiment shown in FIGS. 10 and 11 is a charge accumulating memory having Fin structure.

This charge accumulating memory will be explained by taking a FinFET type charge accumulating memory formed according to the CVD method or ALD method by applying STI technology as an example.

As shown with a side view in FIG. 10, this memory is formed as a MONOS type charge accumulating memory by covering the surrounding of a Fin portion 11 composed of Si with the tunnel layer 12, charge accumulating layer 13, block layer 14 and electrode 15 successively in the shape of a cap such that they overlap one another.

As shown with a top view in FIG. 11, the channel portion of the Fin portion 11 is covered with the tunnel layer 12 and the source and drain portions are extended to both sides to contact an external element. By optimizing the thickness of the channel portion of the Fin portion 11, the threshold can be changed largely. In the meantime, a Fin FET on the SOI can be formed in the same way. Using the Fin FET structure enables a further higher speed operation.

Next, a modification of the second embodiment will be described.

According to this modification, as shown in FIG. 12, the MONOS type charge accumulating memory is formed by covering the surrounding of a Fin portion 21 composed of Si with a tunnel layer 22, charge accumulating layer 23, block layer 24 and electrode 25 successively in the shape of a cap such that they overlap one another.

In this structure, as seen from above in FIG. 13, a buried barrier layer 26 is formed in the Fin portion 21 so that the Fin portion 21 is divided to two sections equally. If this barrier layer 26 is formed of the same substance ($SiO_2$ or SiON) as the tunnel layer 22, these can be formed at the same time in the tunnel layer forming process. In the structure shown in FIG. 12, 2-bit/$4F^2$ memory operation is enabled so that bit density can be improved only by inserting the buried barrier layer 26 into the Fin portion.

The block layer in the nonvolatile semiconductor memory (charge accumulating memory) of the above described embodiment has achieved a higher electronic barrier while possessing the same high dielectric constant as the conventional block layer. This is achieved because electrons are trapped in the high dielectric substance and charged negatively.

Hereinafter, comparative examples with respect to the first and second embodiments and the modifications will be described.

A comparative example 1 considers an example using $HfO_2$ as the block layer. Although in this configuration, the dielectric constant is increased sufficiently, the electronic barrier is lowered, and particularly, electrons are injected from the memory electrode side upon erasing. Thus, erasing becomes unstable and the memory characteristic is very vulnerable.

Comparative example 2 considers an example using $LaAlO_3$ as the block layer. With this configuration, the dielectric constant is increased sufficiently and the electronic barrier is increased extremely. Thus, although the erasing characteristic is stabilized more than comparative example 1, conversely, electrons are injected from the memory electrode side upon erasing similarly. Particularly, there is a tendency that the erasing time is prolonged, which is not preferable in terms of memory characteristic.

The nonvolatile memories (charge accumulating type memory) according to the above-described first and second embodiments and the modifications thereof can obtain the following operations and effects.

(1) Because a block layer having a high dielectric constant is used, a voltage applied to the block layer can be reduced and a large portion of the applied voltage can be applied to the tunnel layer. As a result, high-speed writing/reading/erasing operation by low driving voltage is enabled. Further, by intensifying the dielectric constant of the charge accumulating layer, the voltage can be reduced further.

(2) By adding high valence substance to high dielectric substance composed of trivalent metallic oxide, a level is generated in the band gap and by injecting electrons into that level, a negatively charged block layer can be created.

(3) By adding nitrogen (or carbon, boron, bivalent low valence substance) as well as such high valence substance, the number of electrons in the trap level and energy of the trap level can be controlled, so that a larger amount of accumulated charges can be secured and a negatively charged state can be maintained more stably.

(4) Because charge capturing sectional area can be increased by using base material having a high dielectric constant, the charge capturing efficiency is raised to facilitate negative charging.

Although this embodiment has described an example of configuration for forming a memory cell structure formed on a silicon substrate, the invention is not restricted to this structure. It is permissible to form the memory cell structure of this embodiment by forming a silicon layer on other substrate than the silicon substrate, for example, on a glass substrate.

By using this structure, the nonvolatile semiconductor memory may be formed within a control drive circuit of a display device, for example, liquid crystal display device. In addition to the glass substrate, this embodiment is not restricted to any particular substrate as long as it is a substrate capable of resisting a process temperature at the time of formation of a ceramic substrate, and generating no unnecessary gas at the time of processing.

The nonvolatile semiconductor memory of the above described embodiments may be loaded on a stand-alone type or portable electronic device (for example, personal computer, telephone, PDA, TV, navigation system, recording/reproducing device and the like) so as to memorize data, application software and programs.

Further, it can accumulate image data and sound from an image pickup device (for example, digital still camera, digital video camera). Additionally, it can substitute for the function of a memory or hard disk drive (HDD) loaded on a household appliance and composite type printer fax unit which communicates through a network such as Internet and LAN network.

As described, the present invention is extremely useful for data accumulation and temporary storage like the memory and HDD of the conventional unit. In a circuit of electronic component, it can be loaded on a memory-loaded type system using the nonvolatile memory as an internal memory of the system LSI, a cache memory or part of the electronic circuit. If speaking in the viewpoint of higher level, it can be used as a system LSI which can rewrite an entire system (function of circuit) as required.

Although the respective embodiments have been described about the MONOS type flash memory as an example, the present invention can be applied to a memory circuit in which the MONOS type flash memories are integrated and a system LSI in which a logic circuit is loaded mixedly on the same chip, which are covered by the scope of the present invention. Additionally, those skilled in the art can consider various modifications and corrections within the scope of the spirit of the present invention and it is understood that those modifications and corrections are within the scope of the present invention.

The above-described embodiments include the following matters.

(1) A nonvolatile semiconductor memory comprising: a source area and a drain area provided on a semiconductor substrate with a gap which serves as a channel area; a first insulating layer formed on the channel area; a charge accumulating layer formed on the first insulating layer; a second insulating layer formed on the charge accumulating layer and having a trivalent metallic oxide film supplied with at least one substance selected from a first substance group consisting of Tc, Re, Ru, Os, Rh, Ir, Pd, Pt, Co, Ni, W, Mo, Cr, Mn and Fe; and a control electrode formed on the second insulating layer.

(2) A nonvolatile semiconductor memory comprising: a source area and a drain area provided on a semiconductor substrate with a gap which serves as a channel area; a first insulating layer formed on the channel area; a charge accumulating layer formed on the first insulating layer; a second insulating layer formed on the charge accumulating layer and having a trivalent metallic oxide film supplied with at least one substance selected from the first substance group consisting of Tc, Re, Ru, Os, Rh, Ir, Pd, Pt, Co, Ni, W, Mo, Cr, Mn and Fe and at least one substance elected from a second substance group consisting of nitrogen, carbon, boron, Mg, Ca, Sr and Ba; and a control electrode formed on the second insulating layer.

(3) A nonvolatile semiconductor memory, wherein any one of the selected substance from the first substance group is substituted for a trivalent metal in the trivalent metallic oxide film.

(4) A nonvolatile semiconductor memory, wherein any one of the selected substance from Mg, Ca, Sr or Ba in the second substance group is substituted for a trivalent metal in the trivalent metallic oxide film while any one of the selected substance from nitrogen, carbon or boron is substituted for an oxygen in the trivalent metallic oxide film.

The embodiments of the invention also include the following methods of manufacturing a nonvolatile semiconductor memory.

(1) A method of manufacturing a nonvolatile semiconductor memory constituted of a source/drain and a gate multi-layer substance formed on a semiconductor substrate, in which a first insulating layer, a charge accumulating layer, a second insulating layer having a trivalent metallic oxide film, and a control electrode are formed on the channel area which serves as the gate multi-layer substance such that they overlap one another while a substance selected from the first substance group consisting of Tc, Re, Ru, Os, Rh, Ir, Pd, Pt, Co, Ni, W, Mo, Cr, Mn and Fe is added to the trivalent metallic oxide film.

(2) A method of manufacturing a nonvolatile semiconductor memory constituted of a source/drain and a gate multi-layer substance formed on a semiconductor substrate, in which a first insulating layer, a charge accumulating layer, a second insulating layer having a trivalent metallic oxide film and a control electrode are formed on the channel area which serves as the gate multi-layer substance such that they overlap one another while at least one substance selected from the first substance group consisting of Tc, Re, Ru, Os, Rh, Ir, Pd, Pt, Co, Ni, W, Mo, Cr, Mn and Fe and at least one substance selected from the second substance group consisting of nitrogen, carbon, boron, Mg, Ca, Sr and Ba are added to the trivalent metallic oxide film.

According to the embodiments of the present invention, a large amount of negative charges can be accumulated in the block layer so that both high dielectric constant and high electronic barrier of the block layer are achieved at the same time. Therefore, there can be provided a nonvolatile semiconductor memory with a block layer having a high dielectric constant and having a uniform, sufficiently high electronic barrier stably.

What is claimed is:

1. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element $\alpha$ selected from a first substance group consisting of Tc, Re, Ru, Os, Rh, Ir, Pd, Pt, Co, Ni, W, Mo, Cr, Mn and Fe; and
a control electrode formed on the second insulating layer, wherein the first trivalent metallic oxide film is further supplied with an element $\beta$ selected from a second substance group consisting of nitrogen, carbon, boron, Mg, Ca, Sr and Ba, the second insulating layer includes at least one of a second trivalent metallic oxide film formed between the charge accumulating layer and the first trivalent metallic oxide film and a third trivalent metallic oxide film formed between the first trivalent metallic oxide film and the control electrode, and
when an area density of the element $\alpha$ in the second and third trivalent metallic oxide films is expressed as [MH], an area density of the element $\beta$ in the second and third trivalent metallic oxide films is expressed as [A] and a valence difference of the second substance group is expressed as K, K=1 in case of nitrogen, K=2 in case of carbon, K=3 in case of boron and K=1 in case of Mg, Ca, Sr and Ba,
where the [MH], the [A] and the K belong to a range of $0 \leq \{K \times [A]\}/[MH] \leq 6$ and $1.0 \times 10^{12}$ cm$^{-2}$–$1.3 \times 10^{11}$ cm$^{-2} \times \{K \times [A]\}/[MH] \geq [MH]$.

2. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element $\alpha$ selected from a first substance group consisting of Tc, Re, Ru, Os, Rh, Ir, Pd, Pt, Co, Ni, W, Mo, Cr, Mn and Fe; and
a control electrode formed on the second insulating layer, wherein
the first trivalent metallic oxide film is further supplied with an element $\beta$ selected from a second substance group consisting of nitrogen, carbon, boron, Mg, Ca, Sr and Ba, and a density distribution of the element $\alpha$ and the element $\beta$ is dense in the vicinity of a central plane of the second insulating layer, while it is inclined to be sparse gradually toward a face in contact with the charge accumulating layer and a face in contact with the control electrode.

3. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element $\alpha$ selected from a first substance group consisting of Tc, Re, Ru, Os, Rh, Ir, Pd, Pt, Co, Ni, W, Mo, Cr, Mn and Fe; and
a control electrode formed on the second insulating layer, wherein, in the case the element $\alpha$ is the Tc, Re, Ru, Os, Rh, Ir, Pd, Pt, Co or Ni in the first substance group, the element $\alpha$ has an area density in the first trivalent metallic oxide film of $2 \times 10^{11}$ cm$^{-2}$ to $2.8 \times 10^{14}$ cm$^{-2}$.

4. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element $\alpha$ selected from a first substance group consisting of Tc, Re, Ru, Os, Rh, Ir, Pd, Pt, Co, Ni, W, Mo, Cr, Mn and Fe; and
a control electrode formed on the second insulating layer, wherein, in the case the element $\alpha$ is the W, Mo, Cr, Mn or Fe in the first substance group, the element $\alpha$ has an area density in the first trivalent metallic oxide film of $2\times10^{11}$ cm$^{-2}$ to $2\times10^{14}$ cm$^{-2}$.

5. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element α selected from a first substance group consisting of Tc, Re, Ru, Os, Rh, Ir, Pd, Pt, Co, Ni, W, Mo, Cr, Mn and Fe; and
a control electrode formed on the second insulating layer, wherein the element α has an area density in the first trivalent metallic oxide film of $5\times10^{12}$ cm$^{-2}$ to $0.7\times10^{14}$ cm$^{-2}$.

6. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element α selected from a first substance group consisting of Tc, Re, Ru, Os, Rh, Ir, Pd, Pt, Co, Ni, W, Mo, Cr, Mn and Fe; and
a control electrode formed on the second insulating layer, wherein
the first trivalent metallic oxide film is further supplied with an element β selected from a second substance group consisting of nitrogen, carbon, boron, Mg, Ca, Sr and Ba, and,
in the case the element α is the Tc, Re, Ru, Os, Rh, Ir, Pd, Pt, Co or Ni in the first substance group, the area density in the first trivalent metallic oxide film of the element α is expressed as [MH], the area density in the first trivalent metallic oxide film of the element β is expressed as [A], and the valence difference of the second substance group is expressed as K, K=1 in case of nitrogen, K=2 in case of carbon, K=3 in case of boron and K=1 in case of Mg, Ca, Sr and Ba,
while the [MH], the [A] and the K belong to any one of a first range of $0\leq\{K\times[A]\}/[MH]\leq 1$ and $1.0\times10^{12}$ cm$^{-2}-1.3\times10^{11}$ cm$^{-2}\times\{K\times[A]\}/[MH]\leq[MH]\leq 2.0\times10^{14}$ cm$^{-2}+0.8\times10^{14}$ cm$^{-2}\times\{K\times[A]\}/[MH]$ and a second range of $1\leq\{K\times[A]\}/[MH]\leq 6$ and $1.0\times10^{12}$ cm$^{-2}-1.3\times10^{11}$ cm$^{-2}\times\{K\times[A]\}/[MH]\leq[MH]\leq 2.8\times10^{14}$ cm$^{-2}$.

7. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element α selected from a first substance group consisting of Tc, Re, Ru, Os, Rh, Ir, Pd, Pt, Co, Ni, W, Mo, Cr, Mn and Fe; and
a control electrode formed on the second insulating layer, wherein
the first trivalent metallic oxide film is further supplied with an element β selected from a second substance group consisting of nitrogen, carbon, boron, Mg, Ca, Sr and Ba, and,
in the case the element α is the Tc, Re, Ru, Os, Rh, Ir, Pd, Pt, Co or Ni in the first substance group, the area density in the first trivalent metallic oxide film of the element α is expressed as [MH], the area density in the first trivalent metallic oxide film of the element β is expressed as [A], and the valence difference of the second substance group is expressed as K, K=1 in case of nitrogen, K=2 in case of carbon, K=3 in case of boron and K=1 in case of Mg, Ca, Sr and Ba,
while the [MH], the [A] and the K belong to any one of a third range of $0\leq\{K\times[A]\}/[MH]\leq 3$ and $5.0\times10^{12}$ cm$^{-2}-6.7\times10^{11}$ cm$^{-2}\times\{K\times[A]\}/[MH]\leq[MH]\leq 0.7\times10^{14}$ cm$^{-2}+0.7\times10^{14}$ cm$^{-2}\times\{K\times[A]\}/[MH]$ and a fourth range of $3\leq\{K\times[A]\}/[MH]\leq 6$ and $5.0\times10^{12}$ cm$^{-2}-6.7\times10^{11}$ cm$^{-2}\times\{K\times[A]\}/[MH]\leq[MH]\leq 2.8\times10^{14}$ cm$^{-2}$.

8. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element α selected from a first substance group consisting of Tc, Re, Ru, Os, Rh, Ir, Pd, Pt, Co, Ni, W, Mo, Cr, Mn and Fe; and
a control electrode formed on the second insulating layer, wherein
the first trivalent metallic oxide film is further supplied with an element β selected from a second substance group consisting of nitrogen, carbon, boron, Mg, Ca, Sr and Ba, and,
in the case the element α is the W, Mo, Cr, Mn or Fe in the first substance group, the area density in the first trivalent metallic oxide film of the element α is expressed as [MH], the area density in the first trivalent metallic oxide film of the element β is expressed as [A] and the valence difference of the second substance group is expressed as K, K=1 in case of nitrogen, K=2 in case of carbon, K=3 in case of boron and K=1 in case of Mg, Ca, Sr and Ba,
while the [MH], the [A] and the K belong to any one of a fifth range of $0\leq\{K\times[A]\}/[MH]\leq 1$ and $1.0\times10^{12}$ cm$^{-2}-1.3\times10^{11}$ cm$^{-2}\times\{K\times[A]\}/[MH]\leq[MH]\leq 1.0\times10^{14}$ cm$^{-2}+1.0\times10^{14}$ cm$^{-2}\times\{K\times[A]\}/[MH]$ and a sixth range of $1\leq\{\text{valence difference}\times[A]\}/[MH]\leq 6$ and $1.0\times10^{12}$ cm$^{-2}-1.3\times10^{11}$ cm$^{-2}\times\{K\times[A]\}/[MH]\leq[MH]\leq 2.0\times10^{14}$ cm$^{-2}$.

9. A nonvolatile semiconductor memory, comprising:
a source area and a drain area provided on a semiconductor substrate with a gap which serves as a channel area;
a first insulating layer formed on the channel area;
a charge accumulating layer formed on the first insulating layer;
a second insulating layer formed on the charge accumulating layer and having a first trivalent metallic oxide film supplied with an element α selected from a first substance group consisting of Tc, Re, Ru, Os, Rh, Ir, Pd, Pt, Co, Ni, W, Mo, Cr, Mn and Fe; and
a control electrode formed on the second insulating layer, wherein
the first trivalent metallic oxide film is further supplied with an element β selected from a second substance group consisting of nitrogen, carbon, boron, Mg, Ca, Sr and Ba, and
in the case the element α is the W, Mo, Cr, Mn or Fe in the first substance group, the area density in the first trivalent metallic oxide film of the element α is expressed as [MH], the area density in the first trivalent metallic oxide film of the element β is expressed as [A] and the valence difference of the second substance group is expressed as K, K=1 in case of nitrogen, K=2 in case of carbon, K=3 in case of boron and K=1 in case of Mg, Ca, Sr and Ba, while the [MH], the [A] and the K belong to any one of a seventh range of $0 \leq \{K \times [A]\}/[MH] \leq 2$ and $5.0 \times 10^{12}$ cm$^{-2}$−$6.7 \times 10^{11}$ cm$^{-2} \times \{K \times [A]\}/[MH] \leq [MH] \leq 0.7 \times 10^{14}$ cm$^{-2}$+$6.5 \times 10^{13}$ cm$^{-2} \times \{K \times [A]\}/[MH]$ and an eighth range of $2 \leq \{K \times [A]\}/[MH] \leq 6$ and $5.0 \times 10^{12}$ cm$^{-2}$−$6.7 \times 10^{11}$ cm$^{-2} \times \{K \times [A]\}/[MH] \leq [MH] \leq 2.0 \times 10^{14}$ cm$^{-2}$.

10. A nonvolatile semiconductor memory, comprising:

a source area and a drain area provided on a semiconductor substrate with a gap which serves as a channel area;

a first insulating layer formed on the channel area;

a charge accumulating layer formed on the first insulating layer;

a second insulating layer formed on the charge accumulating layer and having a first trivalent metallic oxide film supplied with an element α selected from a first substance group consisting of Tc, Re, Ru, Os, Rh, Ir, Pd, Pt, Co, Ni, W, Mo, Cr, Mn and Fe; and a control electrode formed on the second insulating layer, wherein the first trivalent metallic oxide film is further supplied with an element β selected from a second substance group consisting of nitrogen, carbon, boron, Mg, Ca, Sr and Ba, and, in the case the element α is substituted for a trivalent metal in the first trivalent metallic oxide film, a total quantity of the element α is expressed as [A], a total quantity of the element β is expressed as [B], the valence difference of the second substance group is expressed as K, K=1 in case of nitrogen, K=2 in case of carbon, K=3 in case of boron, and K=1 in case of Mg, Ca, Sr, and Ba, and the valence difference of the first substance group is expressed as L, L=3 in case of Cr, Mo and W, L=4 in case of Mn, Tc and Re, L=5 in case of Fe, Ru and Os, L=6 in case of Co, Rh and Ir, and L=7 in case of Ni, Pd and Pt, while the [A], the [B], the K and the L belong to a range of $0 \leq \{K \times [B]\}/\{L \times [A]\} \leq 1.0$.

11. A nonvolatile semiconductor memory, comprising:

a source area and a drain area provided on a semiconductor substrate with a gap which serves as a channel area a first insulating layer formed on the channel area a charge accumulating layer formed on the first insulating layer;

a second insulating layer formed on the charge accumulating layer and having a first trivalent metallic oxide film supplied with an element α selected from a first substance group consisting of Tc, Re, Ru, Os, Rh, Ir, Pd, Pt, Co, Ni, W, Mo, Cr, Mn and Fe; and a control electrode formed on the second insulating layer, wherein a dielectric constant of the charge accumulating layer is larger than a dielectric constant of the first trivalent metallic oxide film, and the same element as the element α is added to the charge accumulating layer.

* * * * *